United States Patent
Yoshida

(10) Patent No.: US 11,276,686 B2
(45) Date of Patent: Mar. 15, 2022

(54) SEMICONDUCTOR DEVICE

(71) Applicant: FUJI ELECTRIC CO., LTD., Kanagawa (JP)

(72) Inventor: Kosuke Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 72 days.

(21) Appl. No.: 16/856,028

(22) Filed: Apr. 23, 2020

(65) Prior Publication Data
US 2020/0365582 A1 Nov. 19, 2020

(30) Foreign Application Priority Data

May 15, 2019 (JP) .............................. JP2019-092471
Nov. 29, 2019 (JP) .............................. JP2019-217068

(51) Int. Cl.
| | |
|---|---|
| *H01L 27/06* | (2006.01) |
| *H01L 29/06* | (2006.01) |
| *H01L 29/739* | (2006.01) |
| *H01L 29/40* | (2006.01) |
| *H01L 29/10* | (2006.01) |
| *H01L 27/24* | (2006.01) |
| *H01L 29/66* | (2006.01) |
| *H01L 29/78* | (2006.01) |

(52) U.S. Cl.
CPC ...... *H01L 27/0664* (2013.01); *H01L 27/2454* (2013.01); *H01L 29/063* (2013.01); *H01L 29/1095* (2013.01); *H01L 29/407* (2013.01); *H01L 29/66348* (2013.01); *H01L 29/7397* (2013.01); *H01L 29/7827* (2013.01)

(58) Field of Classification Search
CPC ............ H01L 27/0664; H01L 27/2454; H01L 29/66348; H01L 29/7397; H01L 29/7827; H01L 29/1095; H01L 29/063
See application file for complete search history.

(56) References Cited

U.S. PATENT DOCUMENTS

| | | | |
|---|---|---|---|
| 10,192,977 B2 | 1/2019 | Furukawa | |
| 10,192,978 B2 | 1/2019 | Okuda | |
| 11,158,631 B2 * | 10/2021 | Harada | ............... H01L 29/0638 |
| 2017/0077274 A1 * | 3/2017 | Naito | ................ H01L 29/66348 |

FOREIGN PATENT DOCUMENTS

| | | |
|---|---|---|
| WO | 2015162811 A1 | 10/2015 |
| WO | 2017126167 A1 | 7/2017 |

* cited by examiner

*Primary Examiner* — Joseph C. Nicely

(57) ABSTRACT

There is provided a semiconductor device including: an emitter region of a first conductivity type, a contact region of a second conductivity type, provided on the front surface side of the semiconductor substrate; one or more first trench portions which are electrically connected to a gate electrode and are in contact with emitter regions; a second trench portion which is adjacent to one of the one or more first trench portions, is electrically connected to the gate electrode, is in contact with the contact region of the second conductivity type, and is not in contact with the emitter region; and a dummy trench portion which is adjacent to one of the one or more first trench portions and is electrically connected to an emitter electrode, in which the contact region in contact with the second trench portion is in contact with the emitter electrode.

5 Claims, 40 Drawing Sheets

300

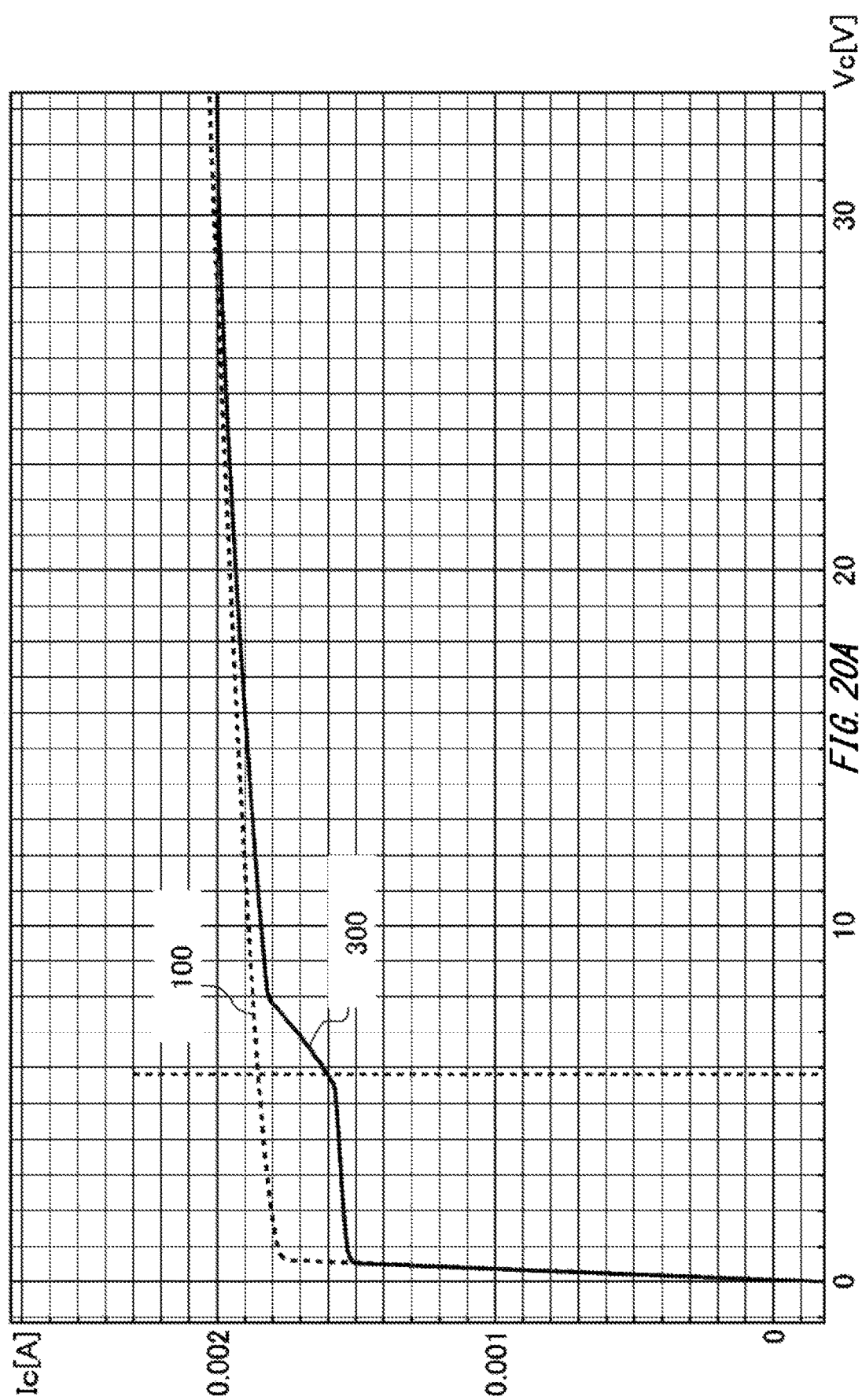

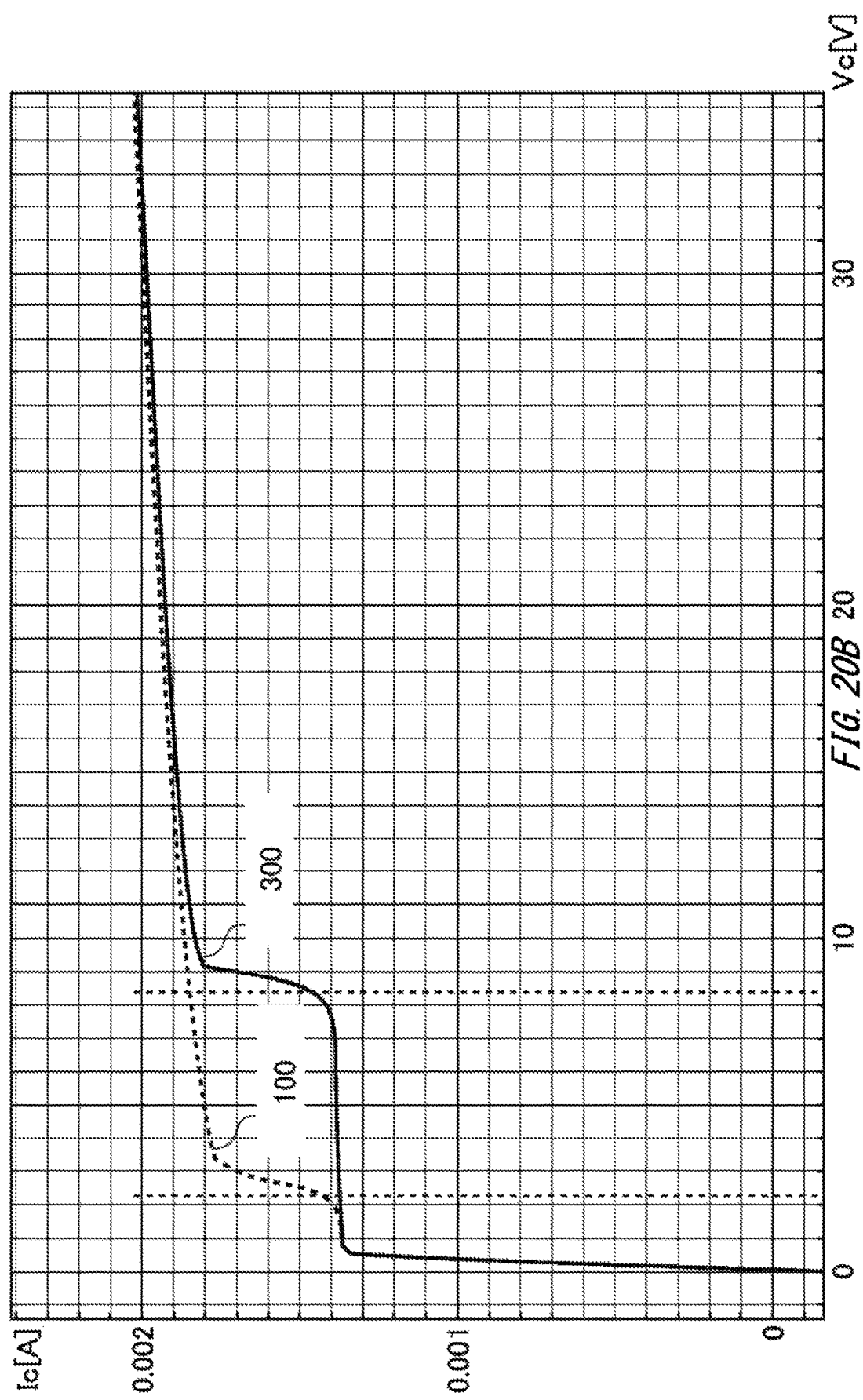

SEMICONDUCTOR DEVICE

The contents of the following Japanese patent application(s) are incorporated herein by reference:

NO. 2019-092471 filed in JP on May 15, 2019, and
NO. 2019-217068 filed in JP on Nov. 29, 2019.

BACKGROUND

1. Technical Field

The present invention relates to a semiconductor device.

2. Related Art

In the related art, an IGBT (Insulated Gate Bipolar Transistor) of a trench gate type, or a vertical MOSFET (metal-oxide-semiconductor field effect transistor) is provided with a dummy trench to prevent an excessive current density (for example, see PTLs 1 and 2).

CITATION LIST

Patent Literature

[PTL 1] Pamphlet of International Publication No. 2015/162811
[PTL 2] Pamphlet of International Publication No. 2017/126167

Problems to be Solved by the Invention

A trench portion that prevents an excessive current density and reduces a turn-on loss is formed.

SUMMARY

In order to solve the above problem, a first aspect of the present invention provides a semiconductor device including: an emitter region of a first conductivity type, provided on a front surface side of a semiconductor substrate; a contact region of a second conductivity type, provided on the front surface side of the semiconductor substrate; one or more first trench portions which are electrically connected to a gate electrode and are in contact with emitter regions; a second trench portion which is adjacent to one of the one or more first trench portions, is electrically connected to the gate electrode, is in contact with the contact region of the second conductivity type, and is not in contact with the emitter region; and a dummy trench portion which is adjacent to one of the one or more first trench portions and is electrically connected to an emitter electrode. The contact region in contact with the second trench portion is in contact with the emitter electrode.

The dummy trench portion may be in contact with the emitter region.

The dummy trench portion may not be in contact with the emitter region.

The semiconductor device may include a plurality of dummy trench portions, and the plurality of dummy trench portions may include both of the dummy trench portion which is in contact with the emitter region, and the dummy trench portion which is not in contact with the emitter region.

One of two trench portions adjacent to the first trench portion may be the second trench portion, and the other may be another first trench portion.

Each of two trench portions adjacent to the first trench portion may be the second trench portion.

One of two trench portions adjacent to at least one of the first trench portions may be the second trench portion, and the other may be the dummy trench portion.

The semiconductor substrate may have: a base region of a second conductivity type, provided below and in contact with the emitter region and the contact region; and an accumulation region of a first conductivity type, provided below and in contact with the base region.

The emitter region may extend from the first trench portion and terminate between the first trench portion and the second trench portion.

A second aspect of the present invention provides a semiconductor device including: an emitter region of a first conductivity type, provided on a front surface side of a semiconductor substrate; a contact region of a second conductivity type, provided on the front surface side of the semiconductor substrate; one or more first trench portions which are electrically connected to a gate electrode and are in contact with emitter regions; a second trench portion which is adjacent to one of the one or more first trench portions, is electrically connected to the gate electrode, and is in contact with the emitter region; and a dummy trench portion which is adjacent to one of the one or more first trench portions and is electrically connected to an emitter electrode. A region where the second trench portion is in contact with the emitter region is narrower than a region where the first trench portion is in contact with the emitter region.

The emitter region may extend from the second trench portion to the first trench portion.

The emitter region may extend from the second trench portion and terminate between the first trench portion and the second trench portion.

The dummy trench portion may be in contact with the emitter region.

The dummy trench portion may not be in contact with the emitter region.

The summary clause does not necessarily describe all necessary features of the embodiments of the present invention. The present invention may also be a sub-combination of the features described above.

BRIEF DESCRIPTION OF THE DRAWINGS

FIG. 15 shows temporal variations of currents and voltages when the trench portions according to Comparative Examples are turned on.

FIG. 16A shows temporal variations of a voltage and a current when the semiconductor device 200 is turned on.

FIG. 16B shows temporal variations of a voltage and a current when the semiconductor device 300 is turned on.

FIG. 16C shows temporal variations of a voltage and a current when the semiconductor device 100 is turned on.

FIG. 17A shows temporal variations of a voltage and a current, and a turn-on loss when the semiconductor device 200 is turned on.

FIG. 17B shows temporal variations of a voltage and a current, and a turn-on loss when the semiconductor device 300 is turned on.

FIG. 17C shows temporal variations of a voltage and a current, and a turn-on loss when the semiconductor device 100 is turned on.

FIG. 18 shows a relationship between dV/dt and a switching loss Eon when the semiconductor device 100, the semiconductor device 200, and the semiconductor device 300 are turned on.

FIG. 20A shows relationships, in semiconductor substrates having no accumulation region 16, between currents and voltages when the semiconductor device 100 and the semiconductor device 300 are turned on.

FIG. 20B shows relationships, in semiconductor substrates having the accumulation regions 16, between currents and voltages when the semiconductor device 100 and the semiconductor device 300 are turned on.

DESCRIPTION OF EXEMPLARY EMBODIMENTS

Hereinafter, the present invention will be described through embodiments of the invention, but the following embodiments do not limit the invention according to the claims. Further, not all the combinations of features described in the embodiments are essential for means to solve the problem in the invention.

In the specification, one side in a direction parallel to a depth direction of a semiconductor substrate is referred to as "upper" or "front", and the other side is referred to as "lower" or "rear". Of two principal surfaces of a substrate, a layer or another member, one surface is referred to as an upper surface and the other surface is referred to as a lower surface. An "upper", "lower" direction, and a "front", "rear" direction are not limited to a direction of gravity, or an attachment direction to a substrate or the like when a semiconductor device is mounted.

In the specification, technical matters may be described using orthogonal coordinate axes of an X axis, a Y axis, and a Z axis. In the specification, a plane parallel to the upper surface of the semiconductor substrate is defined as an XY plane, and a depth direction of the semiconductor substrate is defined as a Z axis. Further, an XYZ system is right-handed coordinates. Note that in the specification, a case where the semiconductor substrate is viewed in a Z axis direction is referred to as a plan view.

Each Example shows an example in which a first conductivity type is set to be an N type, and a second conductivity type is set to be a P type; however, the first conductivity type may be set be the P type and the second conductivity type may be set to be the N type. In this case, conductivity types of a substrate, a layer, a region, and the like in each Example are of opposite polarity.

In the specification, a doping concentration indicates a concentration of an impurity serving as a donor or an acceptor. In the specification, a concentration difference between the donor and the acceptor may be defined as the doping concentration. Further, a peak value of a doping concentration distribution in a doping region may be defined as a doping concentration in the doping region.

In the specification, layers and regions prefixed with N or P mean that majority carriers are electrons or holes, respectively. Further, + or − appended to N or P means a higher doping concentration or a lower doping concentration, respectively, than those of layers and regions without + or −. Further, −− appended to N or P means a lower doping concentration than those of layers and regions with appended −.

Figure 1A:
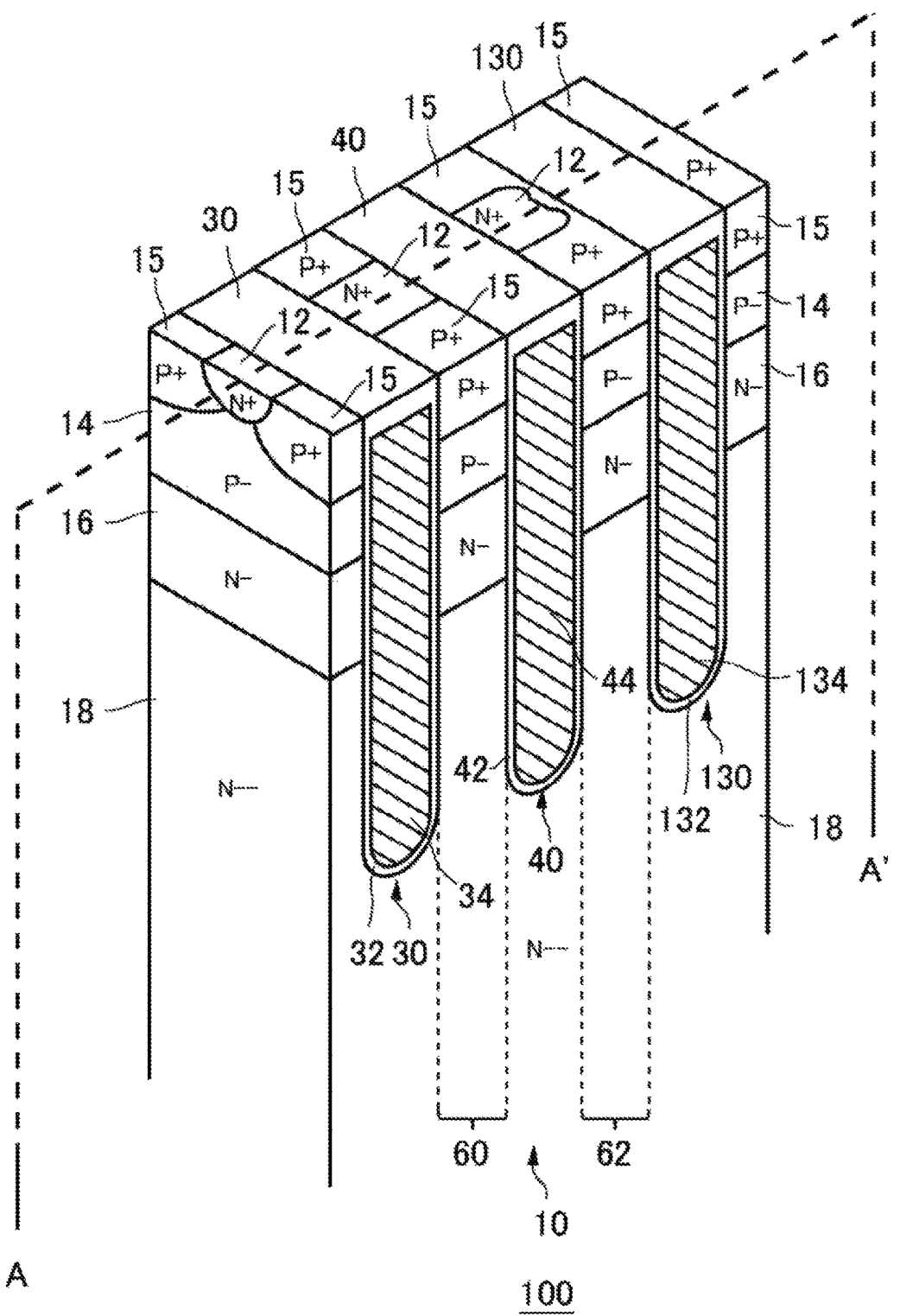
FIG. 1A is an example of a perspective view of a semiconductor device 100.

FIG. 1A is an example of a perspective view of a semiconductor device 100. Note that the semiconductor device 100 may be a vertical MOSFET or another semiconductor device having a transistor with a trench structure.

The semiconductor device 100 of this example includes an emitter contact trench portion 40, a dummy trench portion 30, an emitter non-contact trench portion 130, an emitter region 12, a base region 14, and a contact region 15 on a front surface side of a semiconductor substrate 10. Further, the semiconductor device 100 of this example includes the base region 14 provided, in the depth direction of the semiconductor substrate 10, below and in contact with the emitter region 12 and the contact region 15 which appear on a front surface. Further, the semiconductor device 100 of this example includes an accumulation region 16 provided below and in contact with the base region 14, and a drift region 18 provided below and in contact with the accumulation region 16.

The semiconductor substrate 10 has the emitter region 12, the base region 14, and the drift region 18 in a vicinity of the emitter contact trench portion 40. The semiconductor substrate 10 has the contact region 15, the base region 14, and the drift region 18, in a vicinity of the dummy trench portion 30 or the emitter non-contact trench portion 130. Note that although the semiconductor substrate 10 of this example has the accumulation region 16 between the base region 14 and the drift region 18, the semiconductor substrate 10 may not have the accumulation region 16.

The semiconductor substrate 10 of this example has, as diffusion regions, a mesa portion 60 between the dummy trench portion 30 and the emitter contact trench portion 40, and a mesa portion 62 between the emitter contact trench portion 40 and the emitter non-contact trench portion 130. Further, the semiconductor substrate 10 of this example has a collector region of a first conductivity type on a rear surface side of the semiconductor substrate 10; however, FIG. 1A shows merely a vicinity of the front surface side of the semiconductor substrate.

A plurality of emitter contact trench portions 40 is provided on an upper surface of the semiconductor substrate 10. The emitter contact trench portion 40 is an example of a first trench portion. The emitter contact trench portions 40 are arranged at predetermined intervals along a predetermined arrangement direction (a X axis direction in this example). The emitter contact trench portion 40 extends along an extension direction (an Y axis direction in this example) parallel to the upper surface of the semiconductor substrate 10 and perpendicular to the arrangement direction.

The emitter contact trench portion 40 has a gate conductive portion 44 and a gate insulation film 42. The gate conductive portion 44 is set to a gate potential, and a gate capacitance is generated between the gate conductive portion 44 and a diffusion region of the semiconductor substrate 10 with the gate insulation film 42 interposed therebetween.

In a region where at least any of the emitter region 12, the base region 14, the contact region 15, and the accumulation region 16 is provided, the emitter contact trench portion 40 is provided passing through these regions. A structure in which the emitter contact trench portion 40 penetrates the doping region is not limited to a structure manufactured in the order of forming the doping region and then forming the emitter contact trench portion 40. The structure in which the emitter contact trench portion 40 passes through the doping region also includes a structure in which the emitter contact trench portion 40 is formed and then the doping region is formed between the emitter contact trench portions 40.

The semiconductor substrate 10 may be a silicon substrate, a silicon carbide substrate, or a nitride semiconductor substrate such as gallium nitride. The semiconductor substrate 10 of this example is the silicon substrate.

The emitter region 12 is a region of a first conductivity type, provided on the front surface side of the semiconductor substrate 10. As an example, the emitter region 12 has an N+ type polarity. The emitter region 12 is provided in contact with the emitter contact trench portion 40. The emitter region 12 extends between adjacent emitter contact trench portions 40.

The base region 14 is a region of a second conductivity type, provided below and in contact with the emitter region 12 and the contact region. As an example, the base region 14 has a P− type polarity. The base region 14 is provided in contact with the emitter contact trench portion 40, and when a gate voltage is applied to the emitter contact trench portion 40, an N type channel is generated in the base region 14 in contact with the emitter contact trench portion 40. The base region may be exposed on the front surface of the semiconductor substrate 10. Further, the base region 14 is provided above and in contact with the accumulation region 16.

The contact region 15 is a region of a second conductivity type, provided on the front surface of the semiconductor substrate 10. As an example, the contact region 15 has a P+ type polarity. The contact region 15 is arranged in contact with the emitter region 12 on the front surface of the semiconductor substrate 10. The contact region 15 is provided in contact with the emitter contact trench portion 40 and the emitter non-contact trench portion 130.

The contact region 15 of the P+ type provided at a predetermined depth causes a hole current to flow to the emitter region 12 side so that a latch-up of an IGBT, caused by the conduction of a parasite thyristor can be prevented. In the IGBT, an amount of electrons injected from the emitter region 12 to the base region 14 decreases during a turn-off period, and the hole current becomes dominant. During the turn-off period, the hole current flows from the drift region 18 to an emitter electrode via the base region 14 and the contact region 15.

The accumulation region 16 is a region of a first conductivity type, provided above and in contact with the drift region 18. The accumulation region 16 of this example is of an N− type. The accumulation region 16 suppresses flowing of holes to the front surface side of the semiconductor substrate 10, the holes being injected from a lower surface side of the semiconductor substrate 10 into the drift region 18. The accumulation region 16 increases a carrier density on a front surface side of the drift region 18. The accumulation region 16 modulates a conductivity of the semiconductor device 100 by a carrier injection enhancement effect (IE effect). Accordingly, it is possible to reduce a channel resistance of the semiconductor device 100, and to reduce a turn-on loss.

The drift region 18 is a region of a first conductivity type, provided in the semiconductor substrate 10. The drift region 18 in this example is of an N--type. The drift region 18 may be a remaining region where another doping region is not formed in the semiconductor substrate 10. That is, a doping concentration of the drift region 18 may be a doping concentration of the semiconductor substrate 10.

A plurality of dummy trench portions 30 is provided on the front surface of the semiconductor substrate 10. As with the emitter contact trench portion 40, the dummy trench portions 30 are arranged at predetermined intervals along a predetermined arrangement direction (the X axis direction in this example). As with the emitter contact trench portion 40, the dummy trench portion 30 extends along an extension direction (the Y axis direction in this example) perpendicular to the arrangement direction. The dummy trench portion 30 is adjacent to at least one emitter contact trench portion 40 via the mesa portion 60 on the front surface of the semiconductor substrate 10.

The dummy trench portion 30 has a dummy insulation film 32 and a dummy conductive portion 34. The dummy conductive portion 34 is set to an emitter potential. As an example, the dummy trench portion 30 has a ground potential; however, the emitter potential may be a different one. The gate capacitance is generated between the dummy conductive portion 34 and the diffusion region of the semiconductor substrate 10 with the dummy insulation film 32 interposed therebetween.

The dummy trench portion 30 of this example is provided in contact with the emitter region 12 on the front surface of the semiconductor substrate 10; however, the dummy trench portion 30 may be provided not in contact with the emitter region 12. Since the gate voltage is not applied to the dummy trench portion 30, the N type channel is not generated in the base region 14 in contact with the dummy trench portion 30. Therefore, a current density between a collector and an emitter is reduced in the mesa portion 60 in contact with the dummy trench portion 30.

A plurality of emitter non-contact trench portions 130 is provided on the front surface of the semiconductor substrate 10. The emitter non-contact trench portion 130 is an example of a second trench portion. The emitter non-contact trench portion 130 is not in contact with the emitter region 12 on the front surface of the semiconductor substrate 10. The emitter non-contact trench portion 130 is in contact with the contact region 15 or the base region 14 on the front surface of the semiconductor substrate 10. The emitter non-contact trench portion 130 is adjacent to at least one emitter contact trench portion 40 via the mesa portion 62 on the front surface of the semiconductor substrate 10.

The emitter non-contact trench portion 130 has a gate conductive portion 134 and a gate insulation film 132. The gate conductive portion 134 is set to the gate potential, and the gate capacitance is generated between the gate conductive portion 134 and the diffusion region of the semiconductor substrate 10 with the gate insulation film 132 interposed therebetween.

The emitter non-contact trench portion 130 is not in contact with the emitter region 12, and thus does not operate as an NPN transistor in the depth direction of the diffusion region in contact with the emitter non-contact trench portion 130. On the other hand, since the gate voltage is applied to the emitter non-contact trench portion 130, electrons in the base region 14 in contact with the emitter non-contact trench portion 130 are attracted to the vicinity of the emitter non-contact trench portion 130. In the semiconductor substrate 10, since a region in contact with the emitter non-contact trench portion 130 does not operate as the NPN transistor, the current density is lower in the mesa portion 62 provided with the emitter non-contact trench portion 130 than in the mesa portion interposed between the emitter contact trench portions 40.

In the mesa portion 62 between the emitter contact trench portion 40 and the emitter non-contact trench portion 130, electrons in the base region 14 are attracted to the emitter contact trench portion 40 and the emitter non-contact trench portion 130, respectively, at a time of turn-on. Therefore, the mesa portion 62 as a whole is in a state of having a great number of electrons, and thus a current flowing through the mesa portion 62 is mainly a current with electrons as carriers.

On the other hand, in a region between the emitter contact trench portion 40 and the dummy trench portion 30, electrons are attracted only to the base region 14 in the vicinity of the emitter contact trench portion 40 at the time of turn-on. That is, an amount of electrons present in the mesa portion 60 between the emitter contact trench portion 40 and the dummy trench portion 30 is smaller than that in the mesa portion 62 between the emitter contact trench portion 40 and the emitter non-contact trench portion 130.

The mesa portion 60 is interposed between the gate conductive portion 44 having the gate potential and the dummy conductive portion 34 having the emitter potential. Further, the mesa portion 62 is interposed between the gate conductive portion 44 having the gate potential and the gate conductive portion 134 having the gate potential.

In comparison with the mesa portion 62, the mesa portion 60 has a potential distribution in which a potential gradually becomes low, at a time of switching, from the potential on the gate conductive portion 44 side along a direction from the gate conductive portion 44 toward the dummy conductive portion 34. Accordingly, in the mesa portion 60 as a whole, the increase of the potential is slowed resulting in a longer switching time.

In order to set the emitter contact trench portion 40 and the emitter non-contact trench portion 130 to the gate voltage, the gate voltage is applied to these trench portions at the time of turn-on. The gate conductive portion 44 of the emitter contact trench portion 40, the mesa portion in contact with the emitter contact trench portion 40, and the gate insulation film 42 therebetween act as gate capacitors that accumulate electric charges when the gate voltage is applied to the emitter contact trench portion 40. Correspondingly, the gate conductive portion 134 of the emitter non-contact trench portion 130, the mesa portion 62 in contact with the emitter non-contact trench portion 130, and the gate insulation film 132 therebetween also act as gate capacitors that accumulate the electric charges when the gate voltage is applied to the emitter non-contact trench portion 130. At times of switching operations of the emitter contact trench portion 40 and the emitter non-contact trench portion 130, the gate capacitors are charged.

On the other hand, the mesa portion 62 is interposed between the gate conductive portion 44 having the gate potential and the gate conductive portion 134 having the gate potential, and thus the potential of the mesa portion 62 is more likely to increase uniformly with an increase of the gate voltage than that of the mesa portion 60, at the time of switching. Accordingly, the switching time is short.

In the semiconductor device 100 of this example, the dummy trench portion 30 adjacent to the emitter contact trench portion 40, and the emitter non-contact trench portion 130 adjacent to the emitter contact trench portion 40 are provided such that two types of mesa portions having a difference in the duration of the switching time are utilized. In a turn-on operation of the semiconductor device 100, the mesa portions 60, 62 having the difference in duration of the switching time are driven stepwise, and the semiconductor device 100 is driven stepwise. The drives correspond to drives of two IGBTs in parallel having characteristics different from each other.

When the semiconductor device 100 is driven stepwise by utilizing the above described difference in the duration of the switching time between the mesa portions, it is possible to reduce a temporal variation of the voltage without using a high gate resistance. That is, in the semiconductor device 100, the turn-on loss is reduced in comparison with a case where the high gate resistance is used.

In the semiconductor device 100, by utilizing the emitter contact trench portion 40 and the emitter non-contact trench portion 130 set to the gate voltage with the short switching time, and by utilizing the mesa portions having the difference in the duration of the switching time, in a combination manner, the turn-on loss of the semiconductor device 100 is reduced. Accordingly, occurring of an electric field concentration in the mesa portion around the emitter contact trench portion 40, which causes a rapid current flow, is prevented, and thus an operation of the semiconductor device 100 at a permissible current density is ensured, and the semiconductor device 100 is protected.

Further, the utilization of the mesa portions having the difference in the duration of the switching time corresponds to a stepwise drive of two IGBTs different from each other. Accordingly, in comparison with a case of driving the IGBTs at once, the operation of the semiconductor device 100 is stabilized against an influence from an external environment. An energy loss is also reduced by the stable operation of the semiconductor device 100.

Figure 1B:
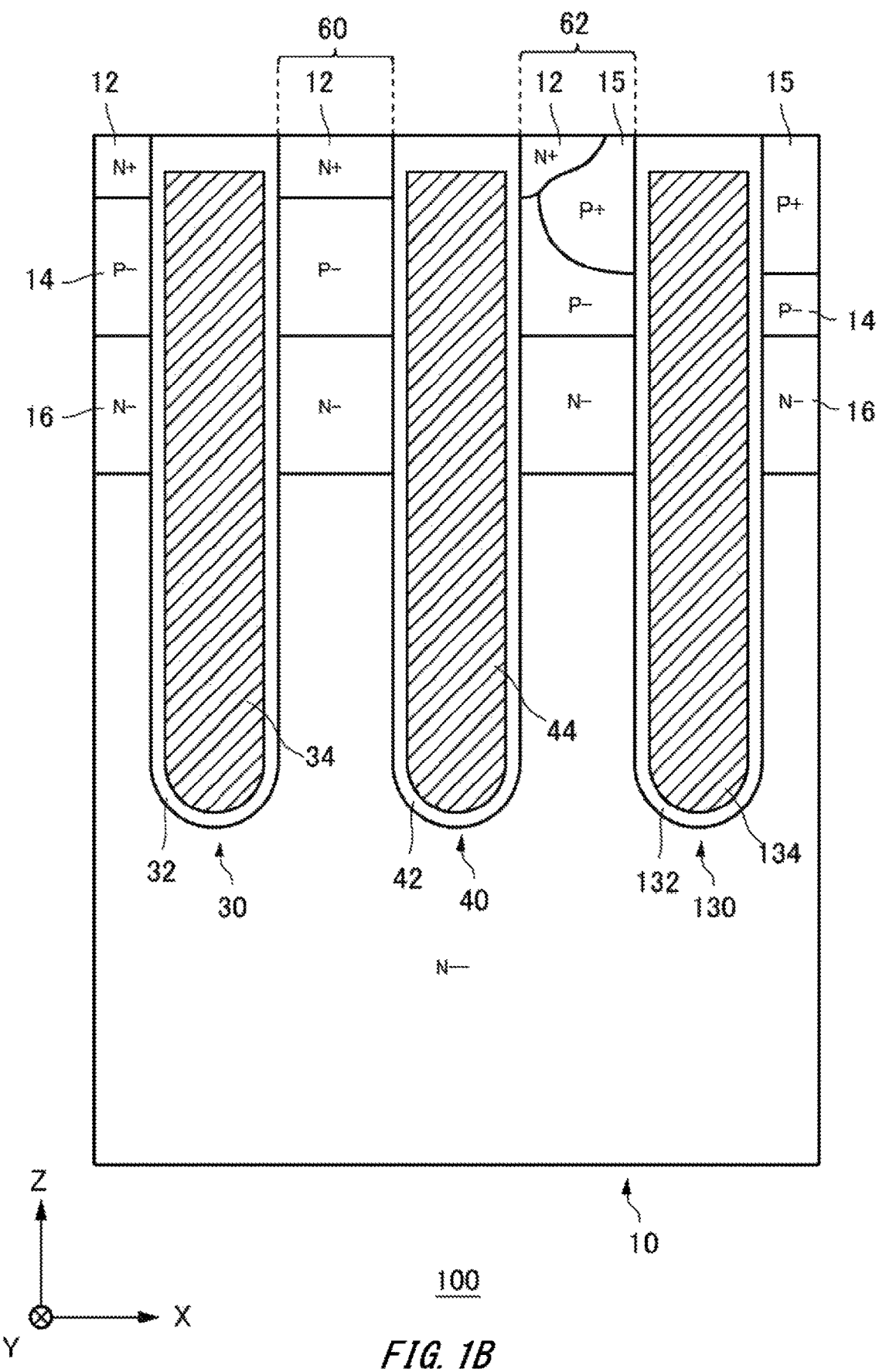
FIG. 1B is an example of a cross-sectional view of the semiconductor device 100.

FIG. 1B is an example of a cross-sectional view of the semiconductor device 100. As an example, the cross-sectional view of FIG. 1B corresponds to cross section A-A' of FIG. 1A.

The contact region 15 in contact with the emitter non-contact trench portion 130 has a structure of entering below the emitter region 12. The contact region 15 enters by a distance at which a generation of the N type channel is not hindered at an interface between the base region 14 and the emitter contact trench portion 40.

Figure 2A:
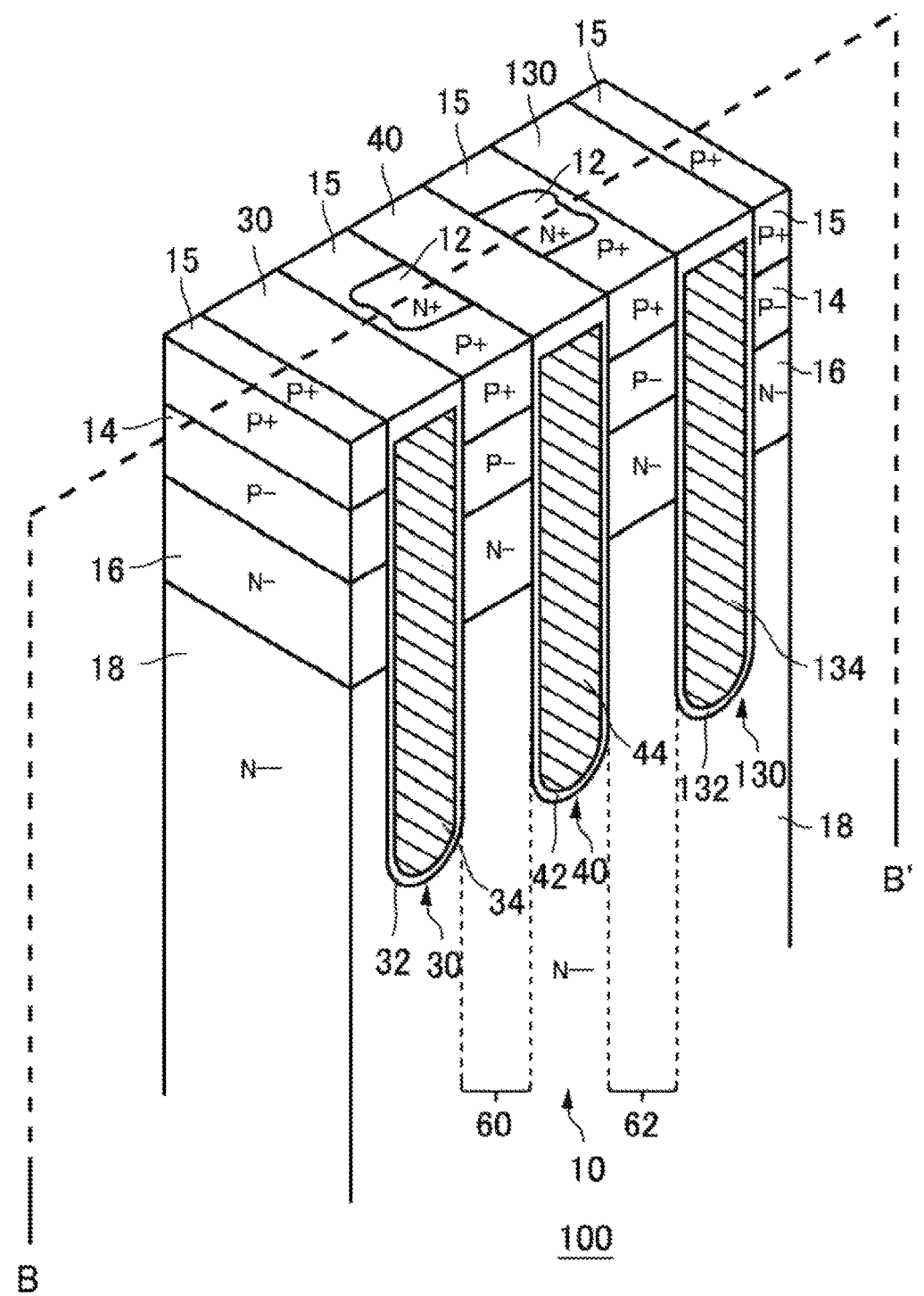
FIG. 2A is another example of the perspective view of the semiconductor device 100.

FIG. 2A is another example of the perspective view of the semiconductor device 100. The semiconductor device 100 of this example includes the semiconductor substrate 10 as in FIG. 1A. Hereinafter, a difference from FIG. 1A will be mainly described.

In this example, the emitter region 12 extends from the emitter contact trench portion 40 to a negative side in the X axis direction, and terminates before reaching the dummy trench portion 30. Therefore, the dummy trench portion 30 of this example is in contact with the contact region 15, but is not in contact with the emitter region 12. The plurality of dummy trench portions 30 may be provided in the semiconductor device 100, and both of the dummy trench portion 30 which is in contact with the emitter region 12 and the dummy trench portion 30 which is not in contact with the emitter region 12 may be provided.

The dummy trench portion 30 is set to the emitter potential, and the gate voltage is not applied to the dummy trench portion 30. Therefore, in this example as well, the dummy trench portion 30 does not need the charging of the gate capacitors in the dummy conductive portion 34, the dummy insulation film 32, and the diffusion region of the semiconductor substrate 10, at the time of turn-on.

In this example as well, the switching time is longer in the mesa portion 60 between the emitter contact trench portion 40 and the dummy trench portion 30 than in the mesa portion 62 between the emitter contact trench portion 40 and the emitter non-contact trench portion 130. By utilizing the difference in the duration of the switching time, a stepwise turn-on operation is possible.

Further, as described above, regardless of whether or not the dummy trench portion 30 is in contact with the emitter region 12, the N type channel is not generated at an interface between the base region 14 and the dummy trench portion 30. Therefore, in the mesa portion 60 having the dummy trench portion 30, the electric field concentration is reduced.

As described above, occurring of an electric field concentration in the mesa portion around the emitter contact trench portion 40, which causes a rapid current flow, is prevented. Accordingly, an operation of the semiconductor device 100 at a permissible current density is ensured.

Figure 2B:
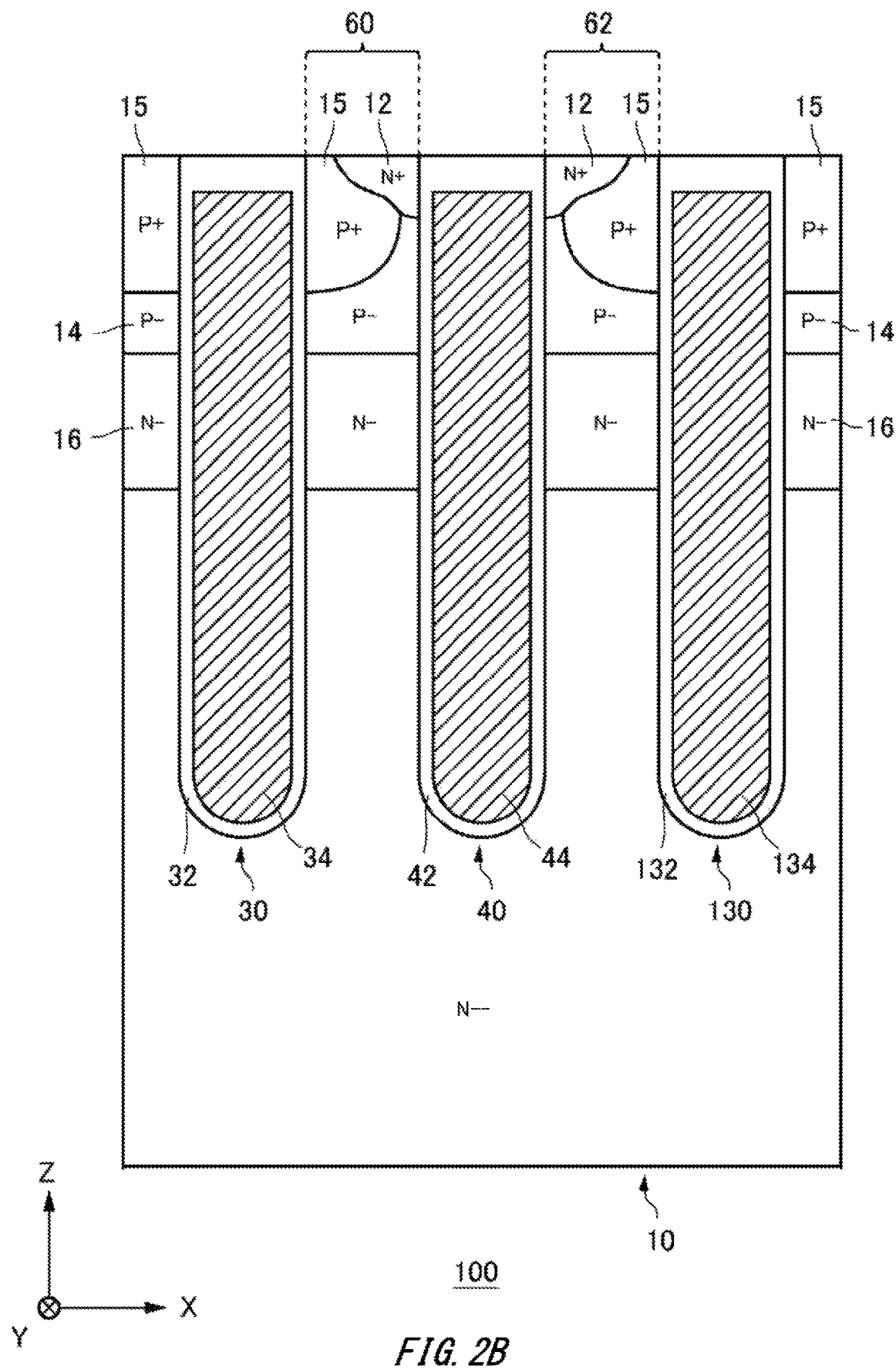
FIG. 2B is another example of the cross-sectional view of the semiconductor device 100.

FIG. 2B is another example of the cross-sectional view of the semiconductor device 100. As an example, the cross-sectional view of FIG. 2B corresponds to cross section B-B' of FIG. 2A. Hereinafter, a difference from FIG. 1B will be described.

In this example, on the dummy trench portion 30 side as well, the contact region 15 in contact with the dummy trench portion 30 enters below the emitter region 12. The contact region 15 enters by a distance at which a generation of the N type channel is not hindered at the interface between the base region 14 and the emitter contact trench portion 40. The contact region 15 may enter below the emitter region 12 between the dummy trench portion 30 and the emitter contact trench portion 40 to the same degree or the different degree to which the contact region 15 enters below the emitter region 12 between the emitter non-contact trench portion 130 and the emitter contact trench portion 40.

Figure 3A:
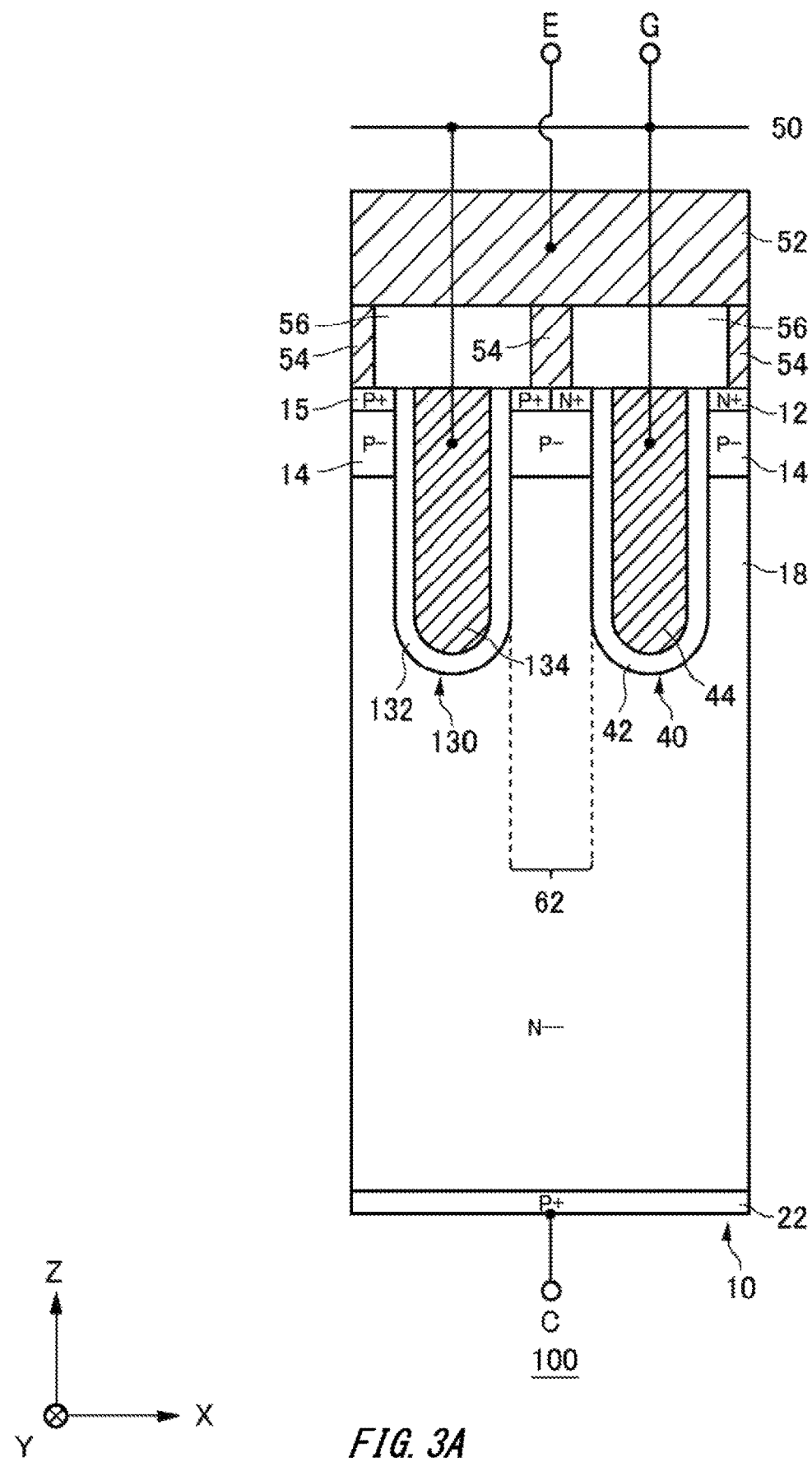
FIG. 3A shows an example of a cross-sectional view of two trench portions which are an emitter non-contact trench portion 130 and an emitter contact trench portion 40, and are provided in the semiconductor device 100.

FIG. 3A shows an example of a cross-sectional view of two trench portions which are an emitter non-contact trench portion 130 and an emitter contact trench portion 40, and are provided in the semiconductor device 100. The emitter non-contact trench portion 130 and the emitter contact trench portion 40 are electrically connected to a gate electrode 50 connected to a gate terminal G, and are both set to the gate potential.

An interlayer insulation film 56 and an emitter electrode 52 are provided above the front surface of the semiconductor substrate 10. The emitter electrode 52 is connected to an emitter terminal E and is set to the emitter potential. The emitter electrode 52 has a conductor 54 divided by the interlayer insulation film 56, and the conductor 54 is provided in contact with the contact region 15.

The base region 14 of the P− type is provided below the emitter region 12 of the N+ type and the contact region 15 of the P+ type. The drift region 18 of the N−-type is provided below the base region 14 of the P− type.

Unlike the example of FIG. 1A, the accumulation region 16 is omitted in this example. Even when the accumulation region 16 is not provided, it is possible to adjust the duration of the switching time by combining the emitter contact trench portion 40, the emitter non-contact trench portion 130, and the dummy trench portion 30. Note that this example is not limited to the case where the accumulation region 16 is not provided.

A collector region of a P+ type is provided below the drift region 18 of the N−-type. The collector region is connected to a collector terminal C and is set to a collector potential.

Figure 3B:
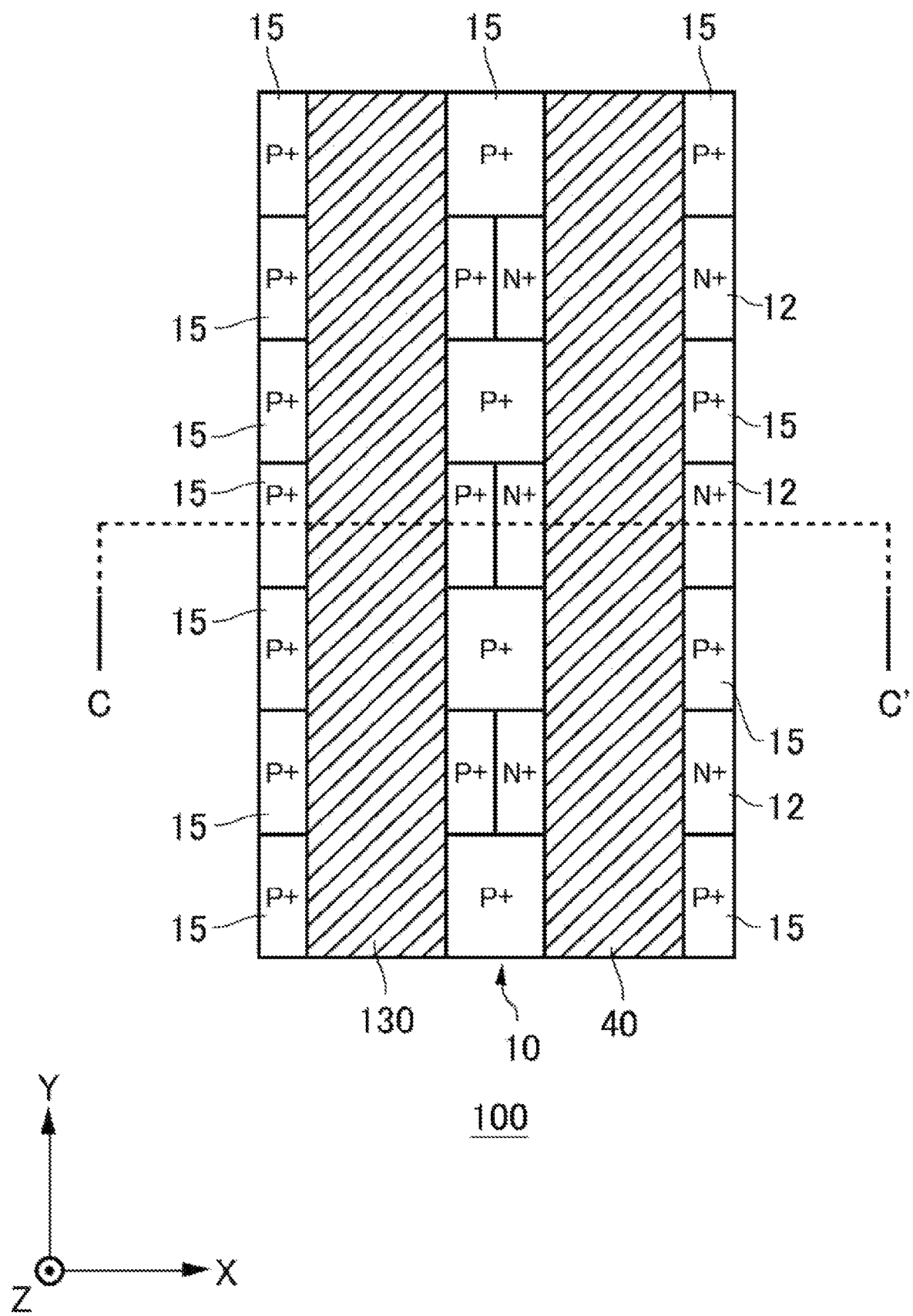
FIG. 3B shows an example of a top plan view of the two trench portions which are the emitter non-contact trench portion 130 and the emitter contact trench portion 40, and are provided in the semiconductor device 100.

FIG. 3B shows an example of a top plan view of the two trench portions which are the emitter non-contact trench portion 130 and the emitter contact trench portion 40, and are provided in the semiconductor device 100. As an example, FIG. 3A corresponds to cross section C-C' of FIG. 3B.

The emitter non-contact trench portion 130 is in contact with the contact region 15 of the P+ type on the front surface of the semiconductor substrate 10. Since no channel is formed in the base region below the emitter non-contact trench portion 130, an excessive current is prevented from flowing through the mesa portion.

On the other hand, on the front surface of the semiconductor device 100, in the diffusion region in contact with the emitter contact trench portion 40, the emitter region 12 of the N+ type and the contact region 15 of the P+ type are alternately disposed at predetermined intervals in the extension direction of the emitter contact trench portion 40. Although the emitter region 12 and the contact region 15 in this example are arranged at regular intervals, the arrangement intervals may be different from each other.

As an example, on the front surface of the semiconductor substrate 10, the emitter region 12 and the contact region 15 in this example have rectangular shapes, but may have square shapes, circular shapes, or the like. Note that in the base region 14 below the emitter region 12, a large channel is preferably formed at the interface with the emitter contact trench portion 40 at the time of turn-on, and a contact portion between the emitter region 12 and the emitter contact trench portion 40 is preferably shaped to have a long tangent so as to decrease a threshold voltage.

Figure 4A:
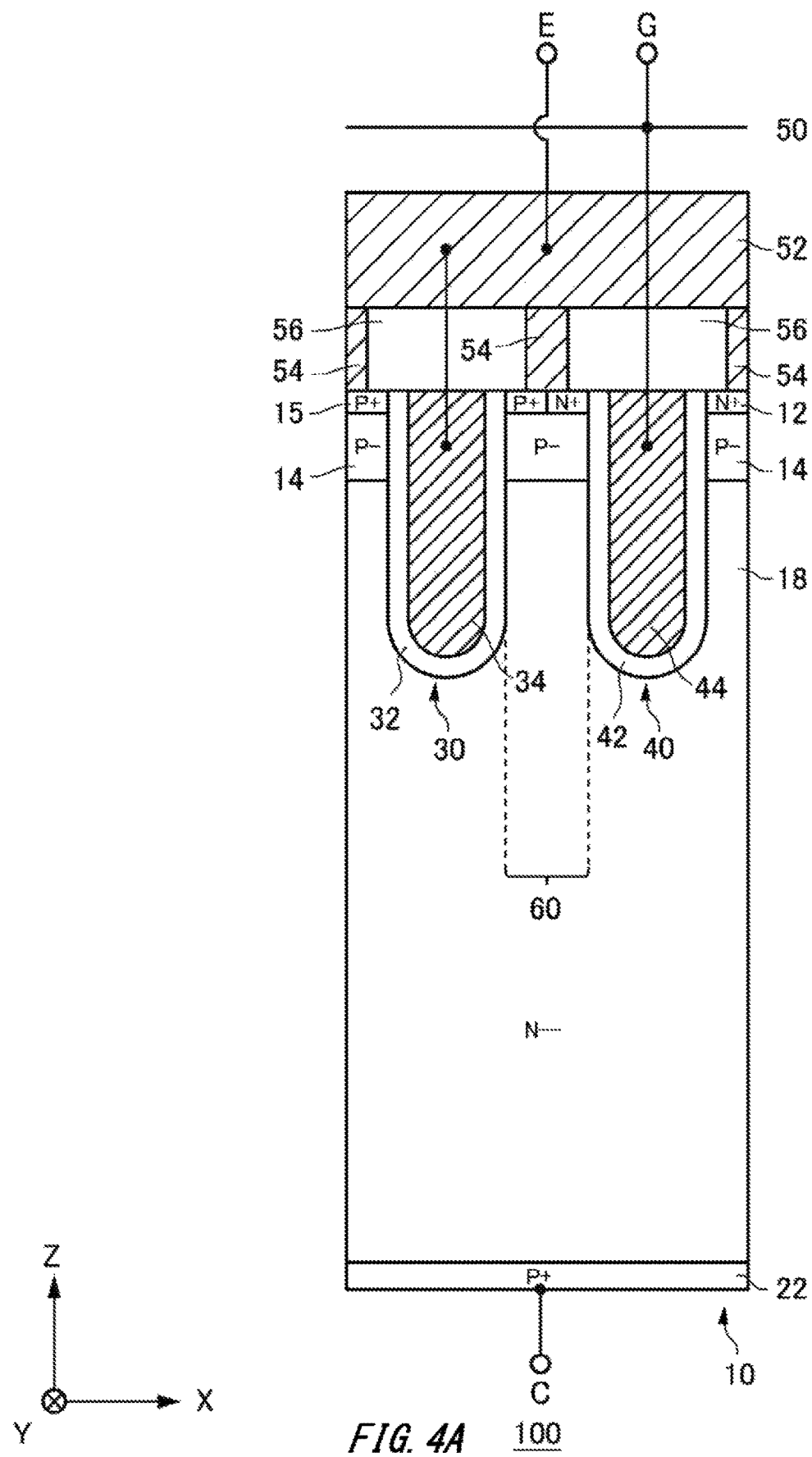
FIG. 4A shows an example of a cross-sectional view of two trench portions which are a dummy trench portion 30 and the emitter contact trench portion 40, and are provided in the semiconductor device 100.

FIG. 4A shows an example of a cross-sectional view of two trench portions which are a dummy trench portion 30 and the emitter contact trench portion 40, and are provided in the semiconductor device 100. The dummy trench portion 30 is connected to the emitter electrode 52, and the emitter electrode 52 is connected to the emitter terminal E and is set to the emitter potential. The emitter potential of the dummy trench portion 30 has a more negative value than the gate potential.

The dummy trench portion 30 of this example is in contact with the contact region 15 of the P+ type on the front surface of the semiconductor substrate 10. To the interface of the base region 14 in the vicinity of the dummy trench portion 30, an electric field from the dummy trench portion 30 having the emitter potential is applied. Since the emitter potential is set to the more negative value than the gate potential, an amount of electrons is smaller and an amount of holes is greater in the mesa portion 60 than in the mesa portion 62, the mesa portion 60 being between the emitter contact trench portion 40 and the dummy trench portion 30, the mesa portion 62 being between the emitter contact trench portion 40 and the emitter non-contact trench portion 130 which respectively have the gate potentials.

Since a mass of a hole is greater than that of an electron, carrier mobility is lower in the hole current than in the electron current. Further, in a state in which there are many holes, recombination of carriers easily occurs, and a flow of the electron current is hindered. Therefore, in the mesa portion 60 between the emitter contact trench portion 40 and the dummy trench portion 30, the switching time is long.

The mesa portion 60 is interposed between the gate conductive portion 44 having the gate potential and the dummy conductive portion 34 having the emitter potential. Further, the mesa portion 62 is interposed between the gate conductive portion 44 having the gate potential and the gate conductive portion 134 having the gate potential.

In comparison with the mesa portion 62, the mesa portion 60 has a potential distribution in which a potential gradually becomes low, at a time of switching, from the potential on the gate conductive portion 44 side along a direction from the gate conductive portion 44 toward the dummy conductive portion 34. Accordingly, in the mesa portion 60 as a whole, the increase of the potential is suppressed, resulting in a longer switching time.

Figure 4B:
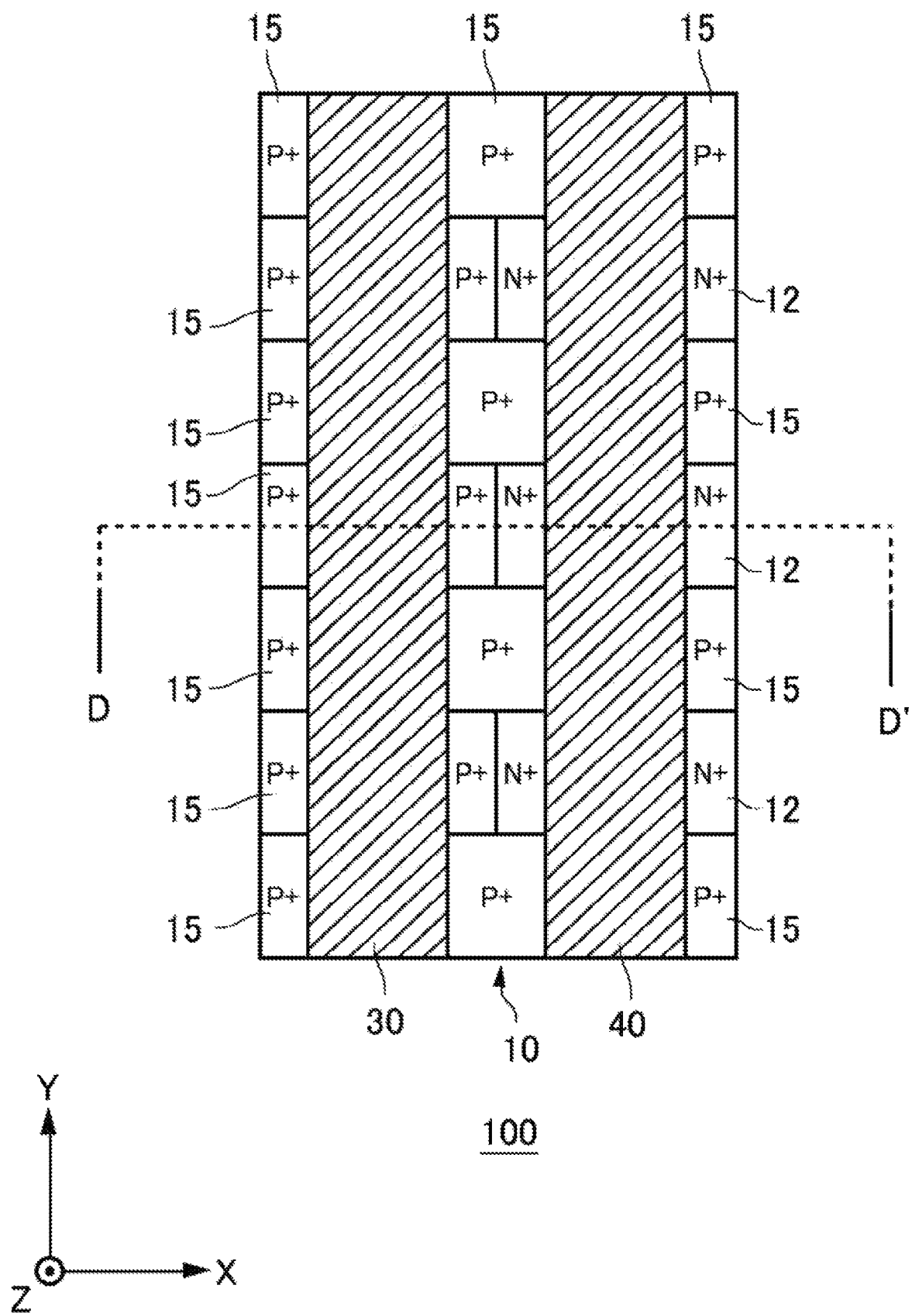
FIG. 4B shows an example of a top plan view of the two trench portions which are the dummy trench portion 30 and the emitter contact trench portion 40, and are provided in the semiconductor device 100.

FIG. 4B shows an example of a top plan view of the two trench portions which are the dummy trench portion 30 and the emitter contact trench portion 40, and are provided in the semiconductor device 100. As an example, FIG. 4A corresponds to cross section D-D' of FIG. 4B.

Distributions of the emitter region 12 and the contact region 15 in FIG. 4B may be similar to those of FIG. 3B except that the emitter non-contact trench portion 130 is replaced with the dummy trench portion 30. Note that the distribution of the diffusion region in FIG. 4B may be a distribution having a shape different from that in FIG. 3B.

Figure 5A:
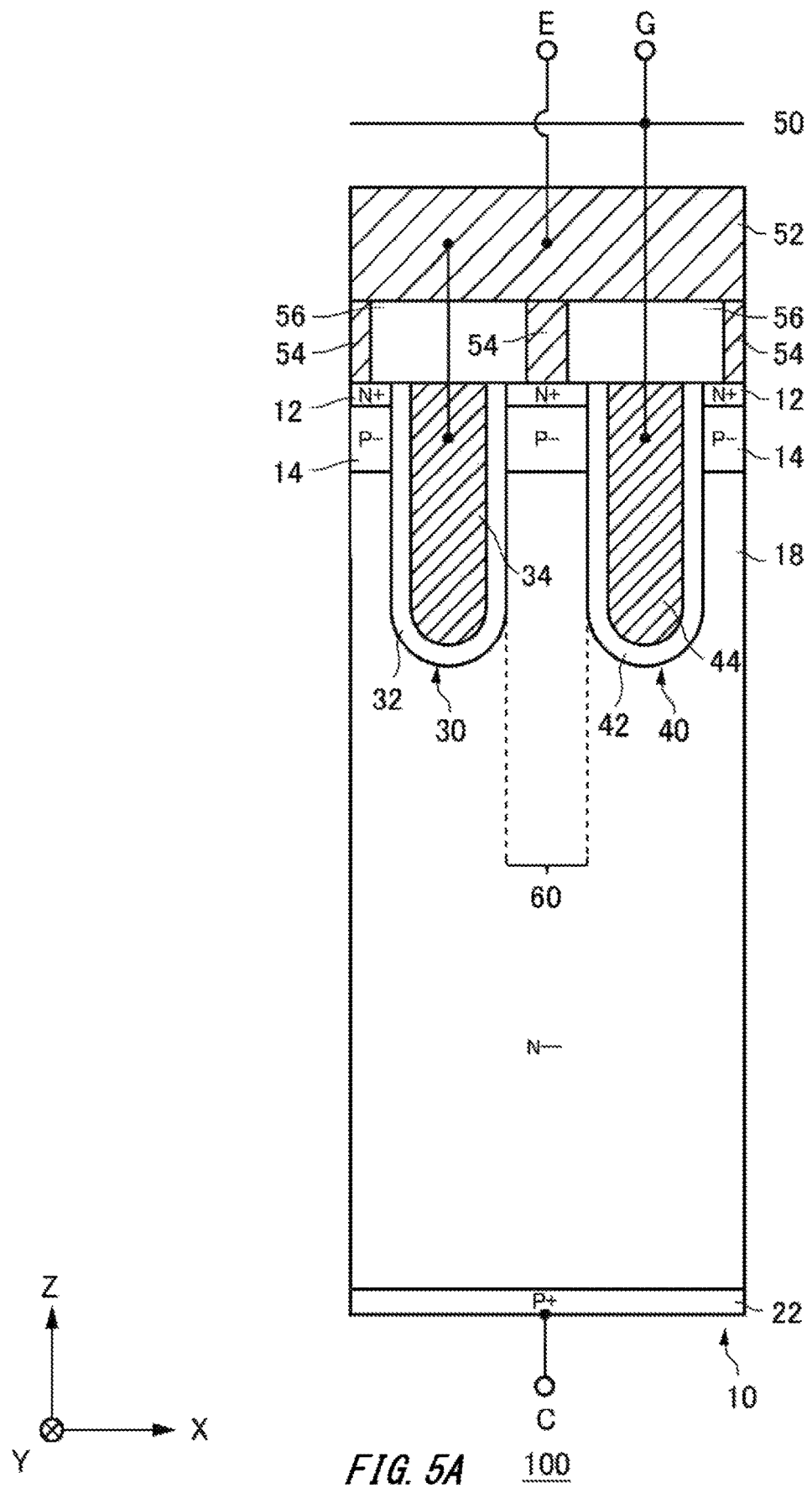
FIG. 5A shows another example of the cross-sectional view of the two trench portions which are the dummy trench portion 30 and the emitter contact trench portion 40, and are provided in the semiconductor device 100.

FIG. 5A shows another example of the cross-sectional view of the two trench portions which are the dummy trench portion 30 and the emitter contact trench portion 40, and are provided in the semiconductor device 100. On the front surface of the semiconductor substrate 10 of this example, the emitter region 12 extends from the emitter contact trench portion 40 to a position in contact with the dummy trench portion 30.

The dummy trench portion 30 of this example is in contact with the emitter region 12 on the front surface of the semiconductor substrate 10. Since the dummy trench portion 30 is set to the emitter potential, even when the dummy trench portion 30 is in contact with the emitter electrode 52, the dummy trench portion 30 generates no channel in the base region 14 provided below the emitter electrode 52, or at least attracts electrons less in comparison with a case where the gate potential is set.

Therefore, carriers between the dummy trench portion 30 and the emitter contact trench portion 40 are in a state in which holes and electrons are mixed, as in FIG. 4A. A mass of a hole is greater than that of an electron, and carrier mobility is lower in the hole current than in the electron current. Further, in a state in which there are many holes, recombination of carriers easily occurs, and a flow of the electron current is hindered. Therefore, the switching time is longer in the mesa portion 60 between the emitter contact trench portion 40 and the dummy trench portion 30 than in the mesa portion 62 between the emitter contact trench portion 40 and the emitter non-contact trench portion 130.

On the other hand, the mesa portion 62 is interposed between the gate conductive portion 44 having the gate potential and the gate conductive portion 134 having the gate potential, and thus the potential of the mesa portion 62 is more likely to increase uniformly with an increase of the gate voltage than that of the mesa portion 60, at the time of switching. Accordingly, the switching time is short.

The dummy trench portion 30 of this example is in contact with the emitter region 12 on the front surface of the semiconductor substrate 10. On the front surface of the semiconductor substrate 10, the dummy trench portion 30 of this example is in contact with the emitter region 12 also on a side opposite to a side adjacent to the emitter contact trench portion 40. Note that the dummy trench portion 30 may be in contact with the contact region 15 on the side opposite to the side adjacent to the emitter contact trench portion 40.

Figure 5B:
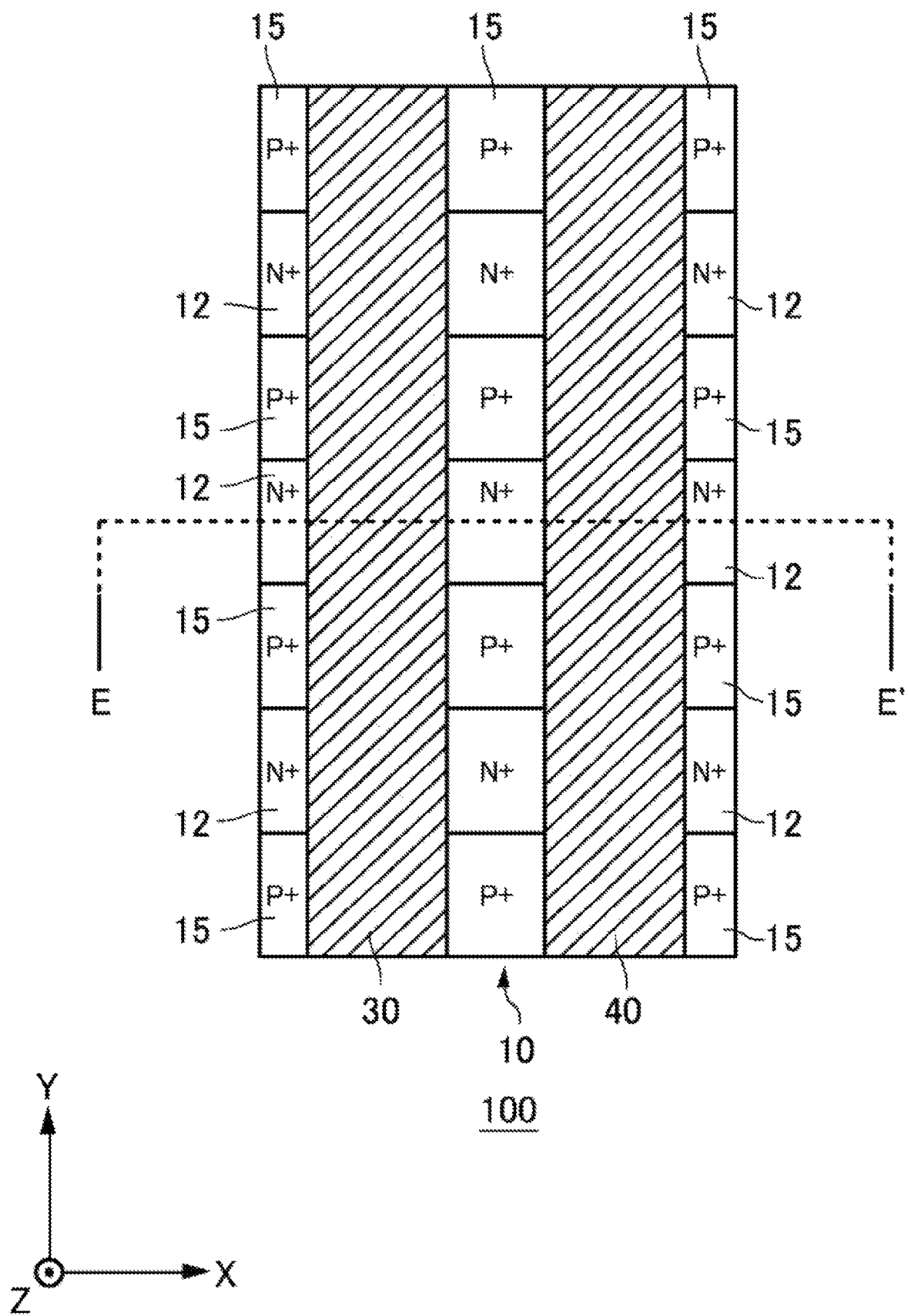
FIG. 5B shows another example of the top plan view of the semiconductor device 100 provided with the two trench portions which are the dummy trench portion 30 and the emitter contact trench portion 40.

FIG. 5B shows another example of the top plan view of the semiconductor device 100 provided with the two trench portions which are the dummy trench portion 30 and the emitter contact trench portion 40. As an example, FIG. 5A corresponds to cross section E-E' of FIG. 5B.

In this example, the mesa portion 60 in contact with the dummy trench portion 30, and the mesa portion 60 in contact with the emitter contact trench portion 40 are alternately doped in the same pattern. The emitter region 12 and the contact region 15 of this example have rectangular shapes, but may have different shapes, as long as a channel region with a sufficient size is formed below the emitter region 12 and the contact region 15 suppresses the latch-up.

A conductivity type in contact with the dummy trench portion 30 is not limited to this pattern. Note that in a case where the mesa portion is provided as in the pattern of this example before the trench portion is provided, the mesa portion can be provided collectively. That is, it is possible to reduce the number of steps of providing the diffusion region.

As a minimum configuration, the trench portion of the semiconductor device 100 has a configuration in which the trench portion of FIG. 3A is combined with any trench portion of FIG. 4A or FIG. 5A. Further, the semiconductor device 100 may have the plurality of emitter contact trench portions 40, the plurality of dummy trench portions 30, and the plurality of emitter non-contact trench portions 130. A ratio with respect to the type and the number of trench portions to be used may be adjusted in accordance with a desired current density and a voltage characteristic at the time of turn-on.

Figure 6A:
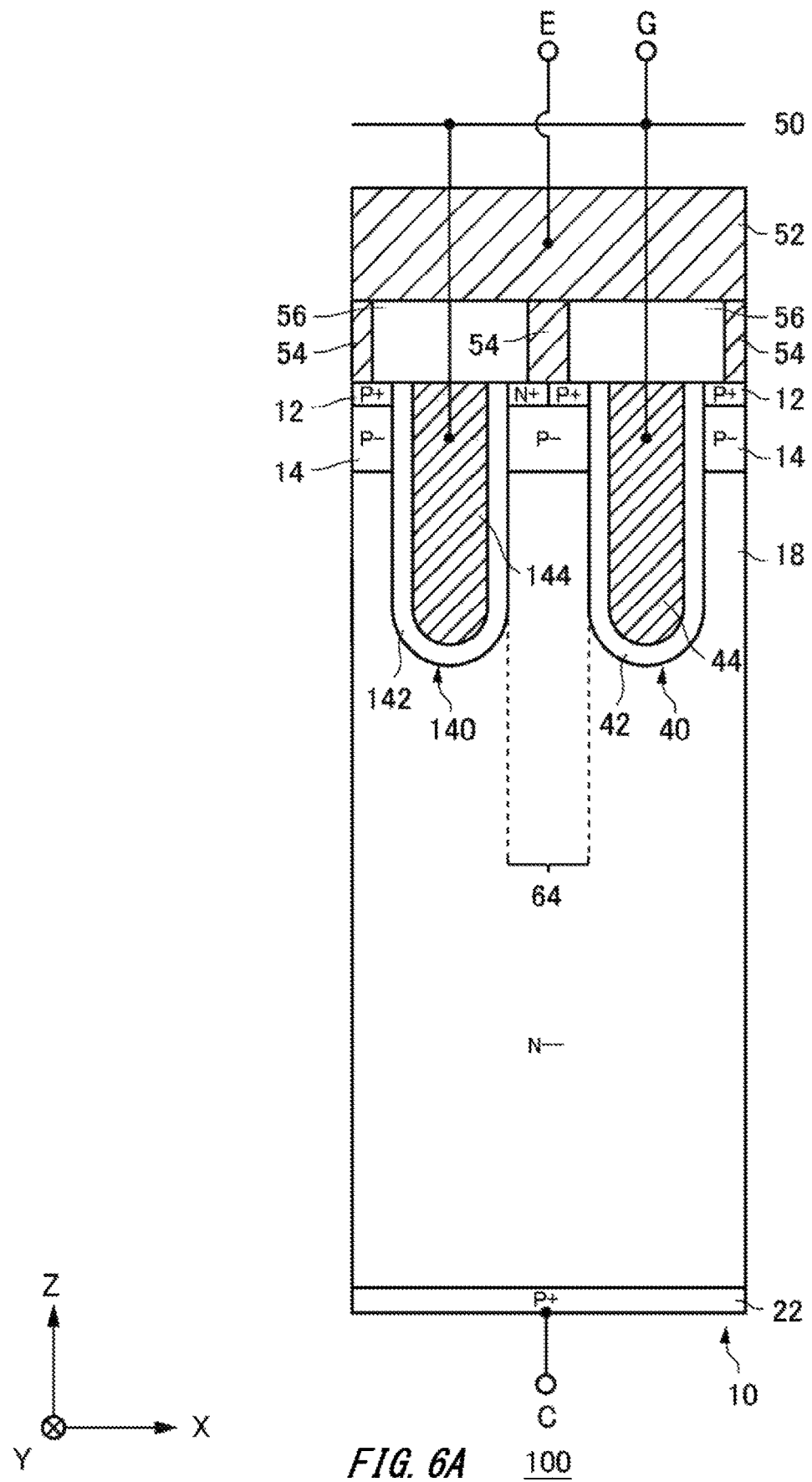
FIG. 6A shows an example of a cross-sectional view of the semiconductor device 100 provided with two trench portions which are the emitter contact trench portion 40 and a narrow emitter contact trench portion 140.

FIG. 6A shows an example of a cross-sectional view of the semiconductor device 100 provided with two trench portions which are the emitter contact trench portion 40 and a narrow emitter contact trench portion 140. As with the emitter non-contact trench portion 130, the narrow emitter contact trench portion 140 is a trench portion adjacent to one of the one or more emitter contact trench portions 40. Hereinafter, a difference between the narrow emitter contact trench portion 140 and the emitter non-contact trench portion 130 will be mainly described.

The narrow emitter contact trench portion 140 has a gate insulation film 142 and a gate conductive portion 144. Materials of the gate insulation film 142 and the gate conductive portion 144 may be the same as those of the gate insulation film 42 and the gate conductive portion 44. The narrow emitter contact trench portion 140 is another example of the second trench portion.

As with the emitter non-contact trench portion 130, the narrow emitter contact trench portion 140 is adjacent to one of the one or more emitter contact trench portions 40, and is in contact with the contact region 15. Further, the gate conductive portion 144 of the narrow emitter contact trench portion 140 is electrically connected to the gate electrode.

The narrow emitter contact trench portion 140 is different from the emitter non-contact trench portion 130 in that the narrow emitter contact trench portion 140 is in contact with the emitter region 12. Note that a region where the narrow emitter contact trench portion 140 is in contact with the emitter region 12 is narrower than a region where the emitter contact trench portion 40 is in contact with the emitter region 12.

In the extension direction of each trench portion (the Y direction) on the front surface of the semiconductor substrate 10, the gate conductive portion 144 of the narrow emitter contact trench portion 140 is in contact with the emitter region 12 via a portion shorter than a portion where the gate conductive portion 44 is in contact with the emitter region 12. Therefore, as with the emitter contact trench portion 40 at the time of turn-on, the narrow emitter contact trench portion 140 has a channel formed in the base region 14 below the emitter region 12, and thus can be driven as a transistor. On the other hand, the channel formed in the narrow emitter contact trench portion 140 is small, and the narrow emitter contact trench portion 140 attracts electrons less than the emitter contact trench portion 40.

For an amount of carriers, the amount of electrons is slightly greater in a mesa portion 64 between the narrow emitter contact trench portion 140 and the emitter contact trench portion 40 than in the mesa portion 62 between the emitter contact trench portion 40 and the emitter non-contact trench portion 130. Therefore, the mesa portion 64 has a shorter switching time than the mesa portion 60 similarly to the mesa portion 62.

Figure 6B:
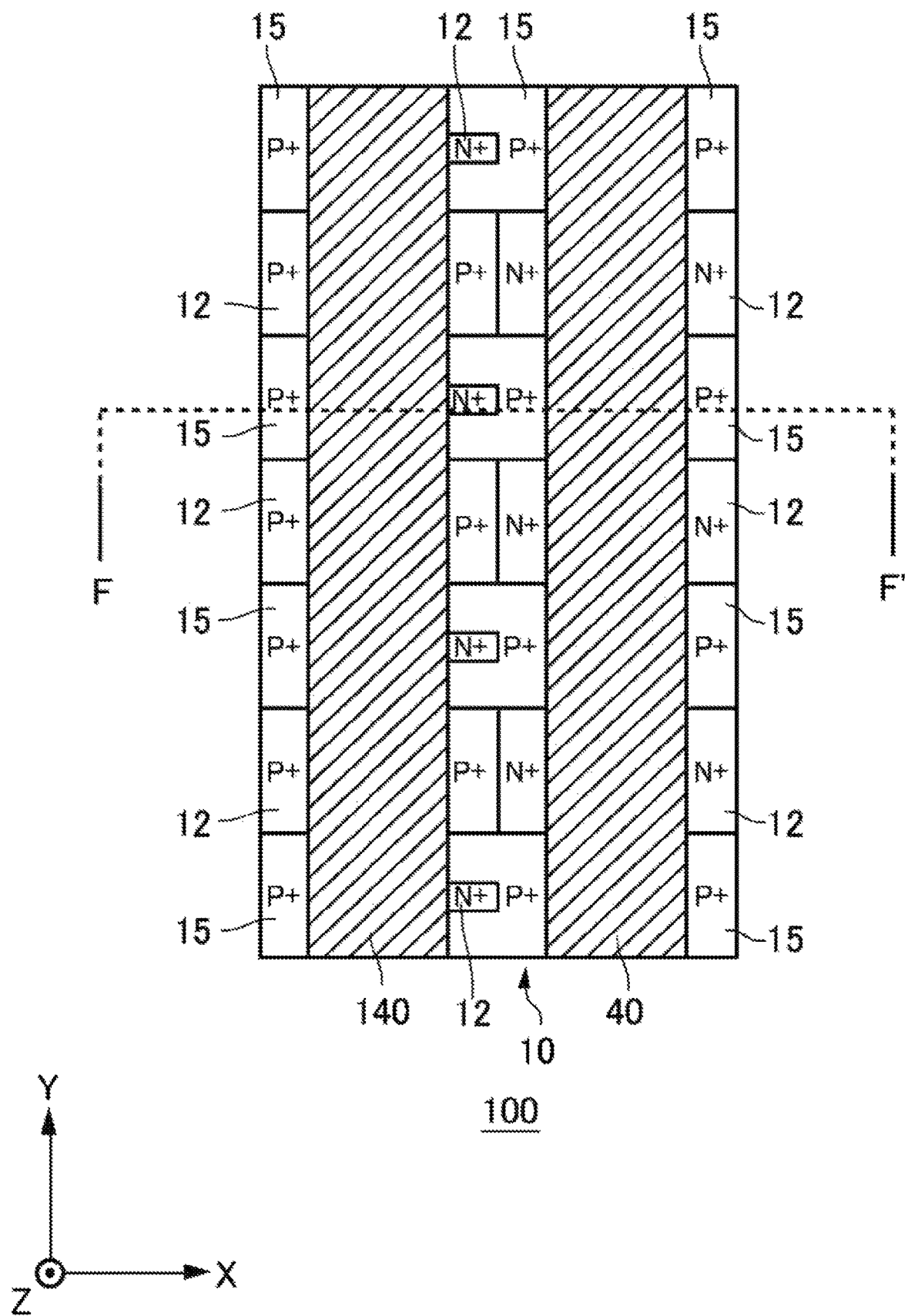
FIG. 6B shows an example of a top plan view of the semiconductor device 100 provided with the two trench portions which are the emitter contact trench portion 40 and the narrow emitter contact trench portion 140.

FIG. 6B shows an example of a top plan view of the semiconductor device 100 provided with the two trench portions. As an example, FIG. 6A corresponds to cross section F-F' of FIG. 6B.

The emitter region 12 of this example is provided to be surrounded by the contact region 15 which is in contact with the emitter contact trench portion 40. That is, the emitter region 12 of this example extends from the narrow emitter contact trench portion 140 and terminates between the narrow emitter contact trench portion 140 and the emitter contact trench portion 40.

The emitter region 12 in this example is in contact with the narrow emitter contact trench portion 140 at a position where the emitter contact trench portion 40 is in contact with the contact region 15 in a Y coordinate. Note that in the Y coordinate, the position where the emitter region 12 is in contact with the narrow emitter contact trench portion 140 may be a position where the emitter contact trench portion 40 is in contact with the emitter region.

Figure 7A:
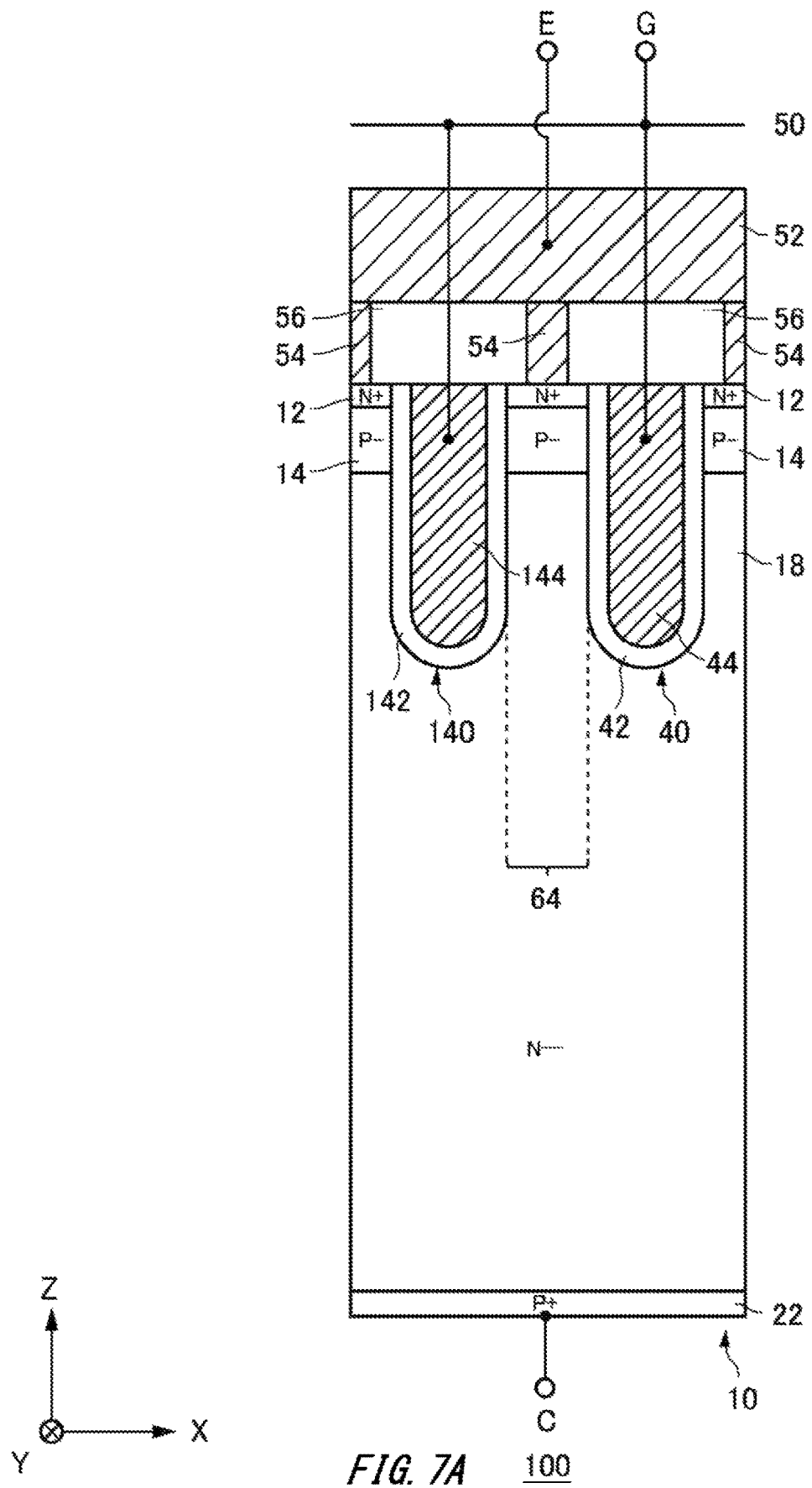
FIG. 7A shows another example of the cross-sectional view of the semiconductor device 100 provided with the two trench portions which are the emitter contact trench portion 40 and the narrow emitter contact trench portion 140.

FIG. 7A shows another example of the cross-sectional view of the semiconductor device 100 provided with the two trench portions which are the emitter contact trench portion 40 and the narrow emitter contact trench portion 140. In this example, the emitter region 12 extends from the narrow emitter contact trench portion 140 to the emitter contact trench portion 40.

Figure 7B:
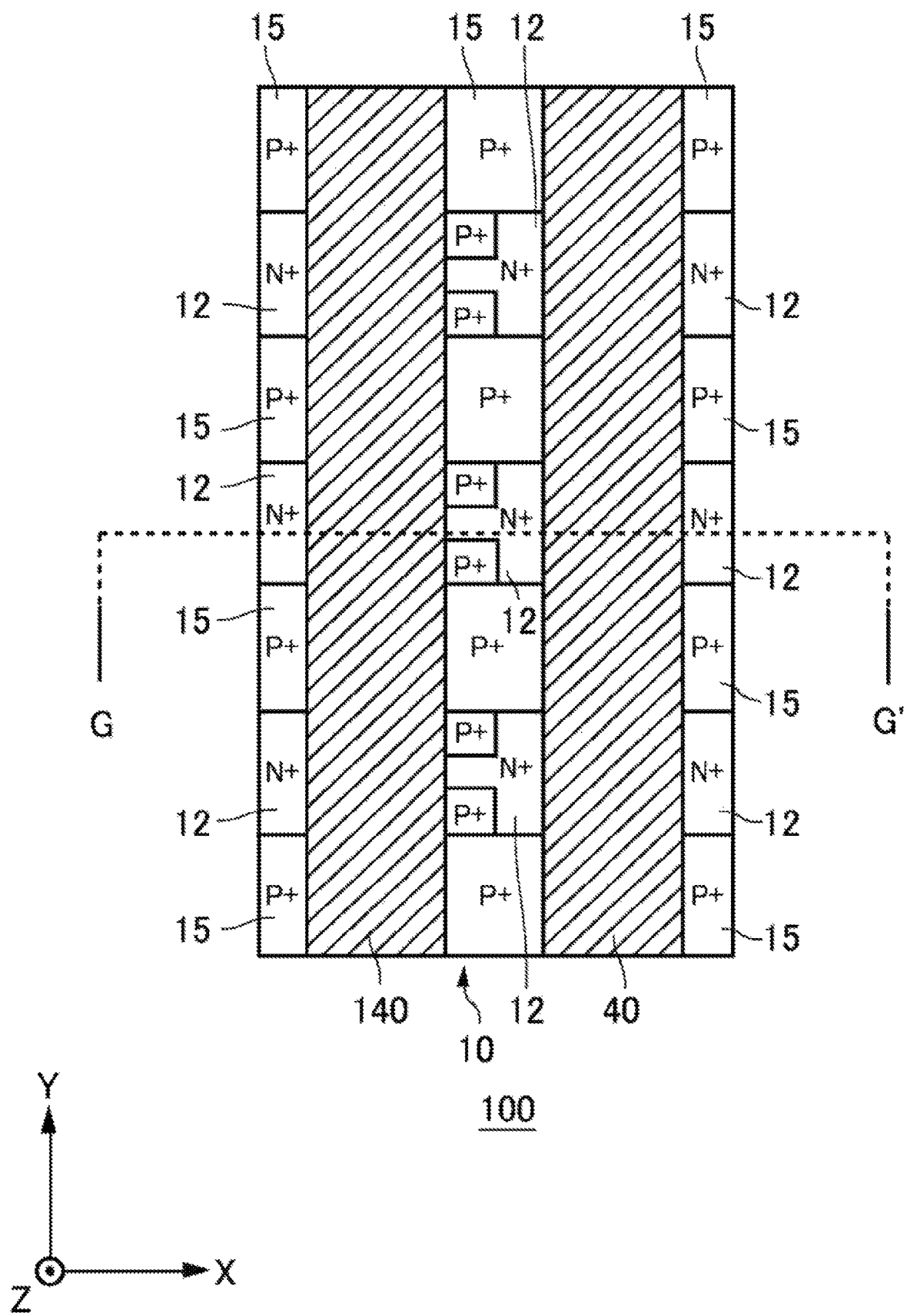
FIG. 7B shows an example of a top plan view of the two trench portions included in the semiconductor device 100.

FIG. 7B shows an example of a top plan view of the two trench portions included in the semiconductor device 100. As an example, FIG. 7A corresponds to cross section G-G' of FIG. 7B.

In this example, the emitter region 12 in contact with the narrow emitter contact trench portion 140 stretches to be connected to the emitter region 12 in contact with the emitter contact trench portion 40. That is, the emitter region 12 of this example extends from the narrow emitter contact trench portion 140 to the emitter contact trench portion 40.

Figure 8A:
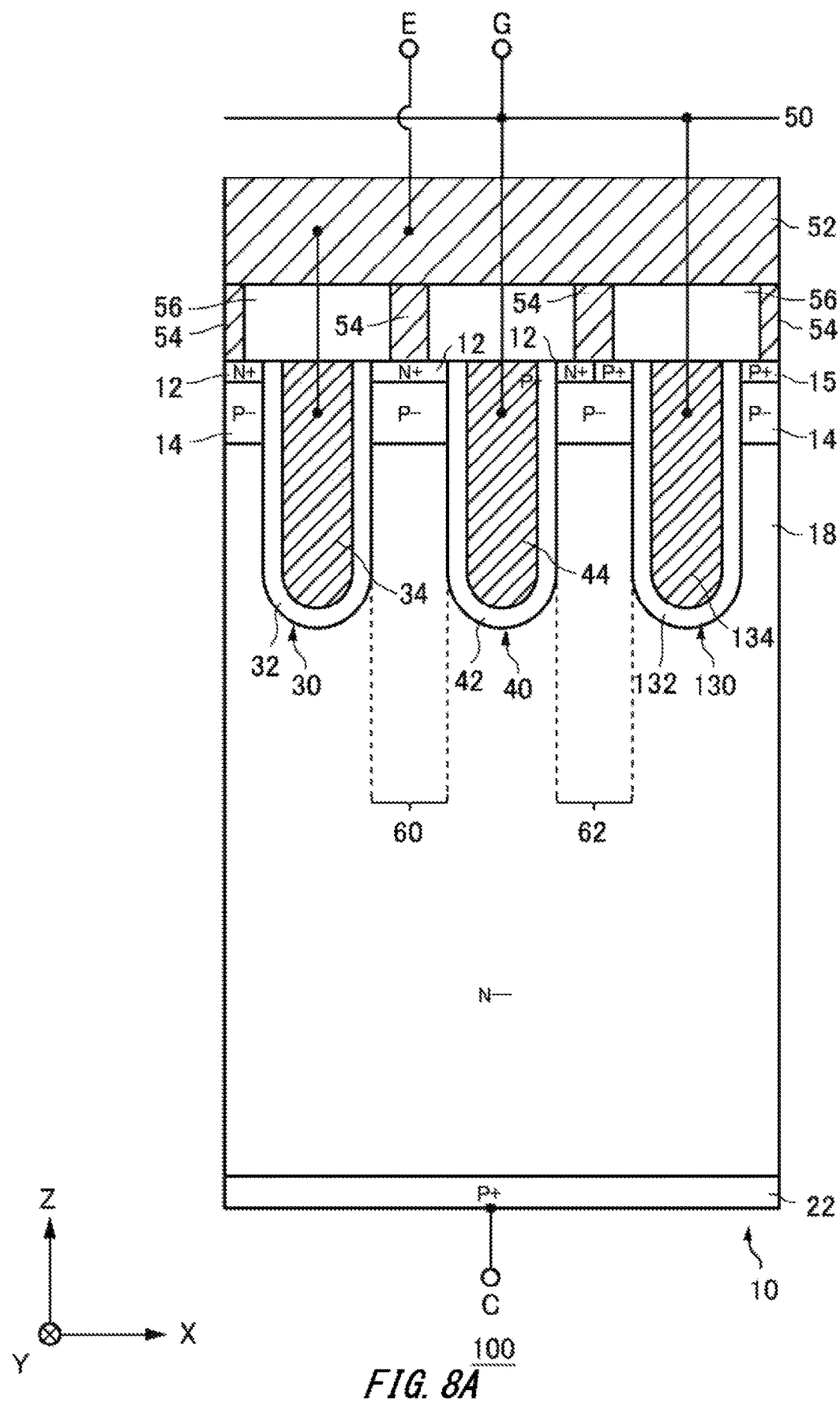
FIG. 8A shows an example of a cross-sectional view of three trench portions included in the semiconductor device 100.

FIG. 8A shows an example of a cross-sectional view of three trench portions included in the semiconductor device 100. In this example, the emitter non-contact trench portion 130, the emitter contact trench portion 40, and the dummy trench portion 30 are provided.

In the semiconductor device 100 of this example, the dummy trench portion 30 and the emitter contact trench portion 40 are in contact with the emitter region 12. The emitter non-contact trench portion 130 is in contact with contact region 15. That is, this example of the trench portions corresponds to an example in which the dummy trench portion 30 in contact with the emitter region 12 as in FIG. 5A is disposed on the negative side of the emitter contact trench portion 40 in the X axis direction, and the emitter non-contact trench portion 130 as in FIG. 3A is disposed on a positive side of the emitter contact trench portion 40 in the X axis direction.

This example has a configuration in which one dummy trench portion 30, one emitter contact trench portion 40, and one emitter non-contact trench portion 130 are included. This example is an example of a minimum configuration in which three different types of trenches are included in order to realize an effect of reducing the turn-on loss by using the difference in the duration of the switching time. The configuration of the trench portions of this example is a configuration corresponding to the trench portions of FIG. 1A and FIG. 1B, and is a configuration obtained by a combination of the trench portions of FIG. 3A and FIG. 5A.

Note that the emitter non-contact trench portion 130 of this example may be replaced with the narrow emitter contact trench portion 140. The mesa portion 64 has a shorter switching time than the mesa portion 60 similarly to the mesa portion 62, and thus the semiconductor device 100 in which the replacement has been performed can also exhibit the same effect.

The base region 14 of the P− type is provided below and in contact with the emitter region 12 and the contact region 15. The drift region 18 of the N−−type is provided below the base region 14. Further, a collector region 22 is provided below the drift region 18. The collector region 22 is connected to the collector terminal C and is set to the collector potential.

Figure 8B:
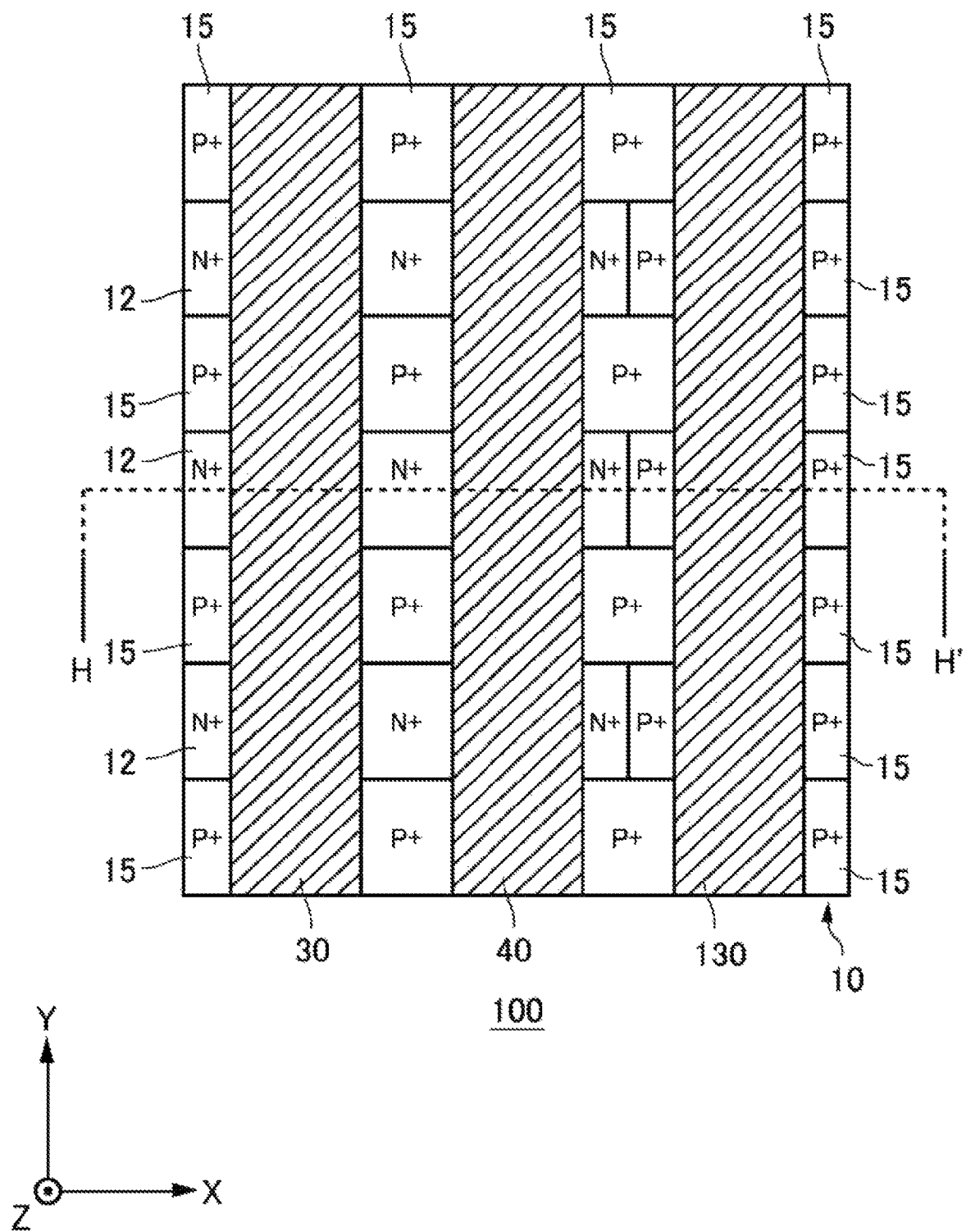
FIG. 8B shows an example of a top plan view of the three trench portions included in the semiconductor device 100.

FIG. 8B shows an example of a top plan view of the three trench portions included in the semiconductor device 100. As an example, FIG. 8A corresponds to cross section H-H' of FIG. 8B.

In this example, the emitter non-contact trench portion 130 is provided in contact with the contact region 15. The emitter contact trench portion 40 and the dummy trench portion 30 are provided in alternate contact with the emitter region 12 and the contact region 15.

That is, for the mesa portion of this example, the dummy trench portion 30 is disposed on the negative side of the emitter contact trench portion 40 in the X axis direction, and the emitter region 12 and the contact region 15 are provided as in FIG. 5B. On the other hand, the emitter non-contact trench portion 130 is disposed on the positive side of the emitter contact trench portion 40 in the X axis direction, and the emitter region 12 and the contact region 15 are provided as in FIG. 3B.

Figure 9A:
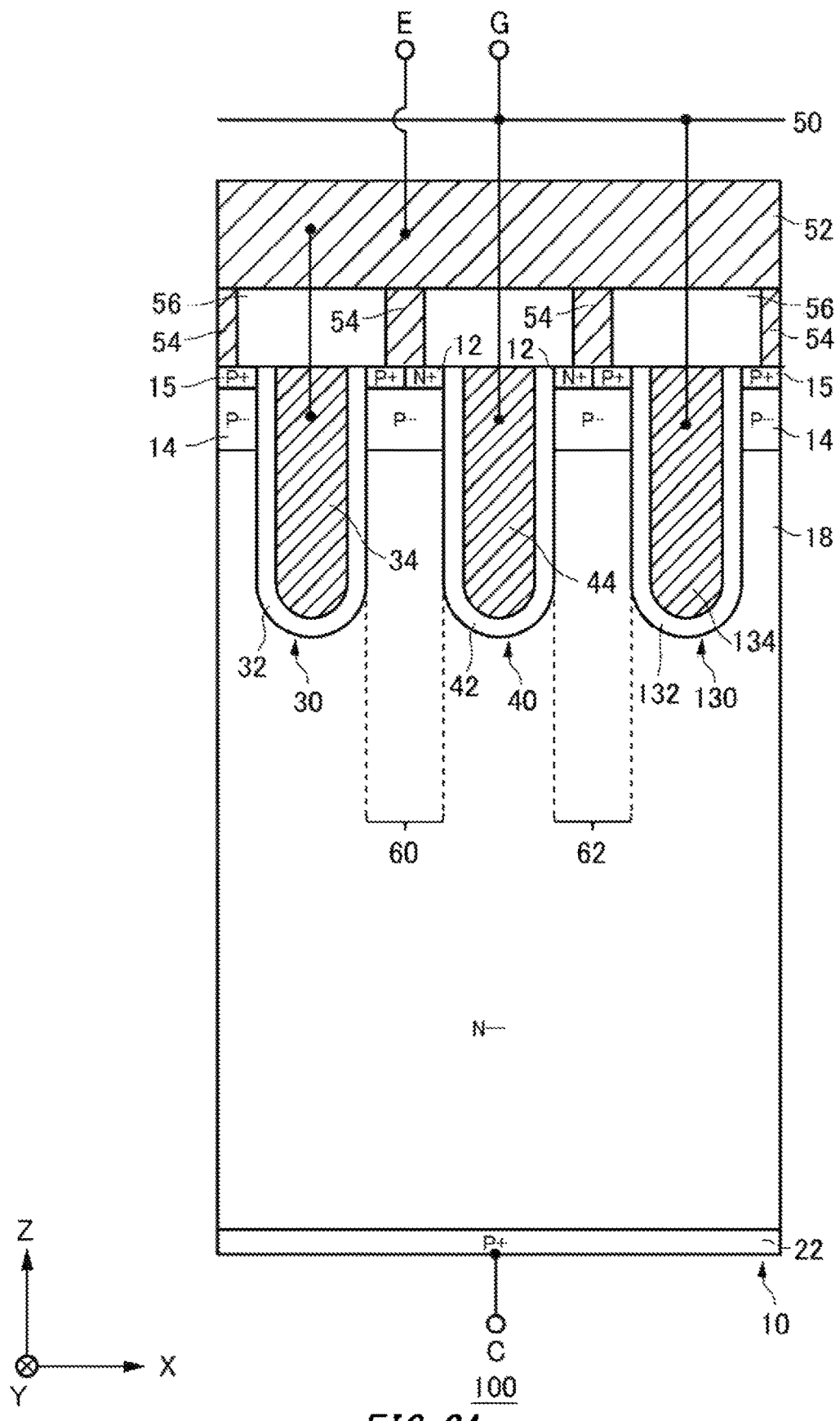
FIG. 9A shows another example of the cross-sectional view of the three trench portions included in the semiconductor device 100.

FIG. 9A shows another example of the cross-sectional view of the three trench portions included in the semiconductor device 100. In this example, the emitter non-contact trench portion 130, the emitter contact trench portion 40, and the dummy trench portion 30 are provided.

In the semiconductor substrate 10 of this example, both sides of the emitter contact trench portion 40 are in contact with the emitter regions 12, and both sides of the dummy trench portion 30 and the emitter non-contact trench portion 130 are respectively in contact with the contact regions 15. That is, this example of the trench portions corresponds to an example in which the emitter non-contact trench portion 130 as in FIG. 3A is disposed on the positive side of the emitter contact trench portion 40 in the X axis direction, and the dummy trench portion 30 in contact with the contact region 15 as in FIG. 4A is disposed on the negative side of the emitter contact trench portion 40 in the X axis direction.

This example has a configuration in which one emitter non-contact trench portion 130, one emitter contact trench portion 40, and one dummy trench portion 30 are included. This example is one of a minimum configuration in which three different types of trenches are included in order to realize an effect of reducing the turn-on loss by using the difference in the duration of the switching time. The configuration of the trench portions of this example is a configuration corresponding to the trench portions of FIG. 2A and FIG. 2B, and is a configuration obtained by a combination of the trench portions of FIG. 3A and FIG. 4A.

Note that the emitter non-contact trench portion 130 of this example may be also replaced with the narrow emitter contact trench portion 140. The mesa portion 64 has a shorter switching time than the mesa portion 60 similarly to the mesa portion 62, and thus the semiconductor device 100 in which the replacement has been performed can also exhibit the same effect.

Figure 9B:
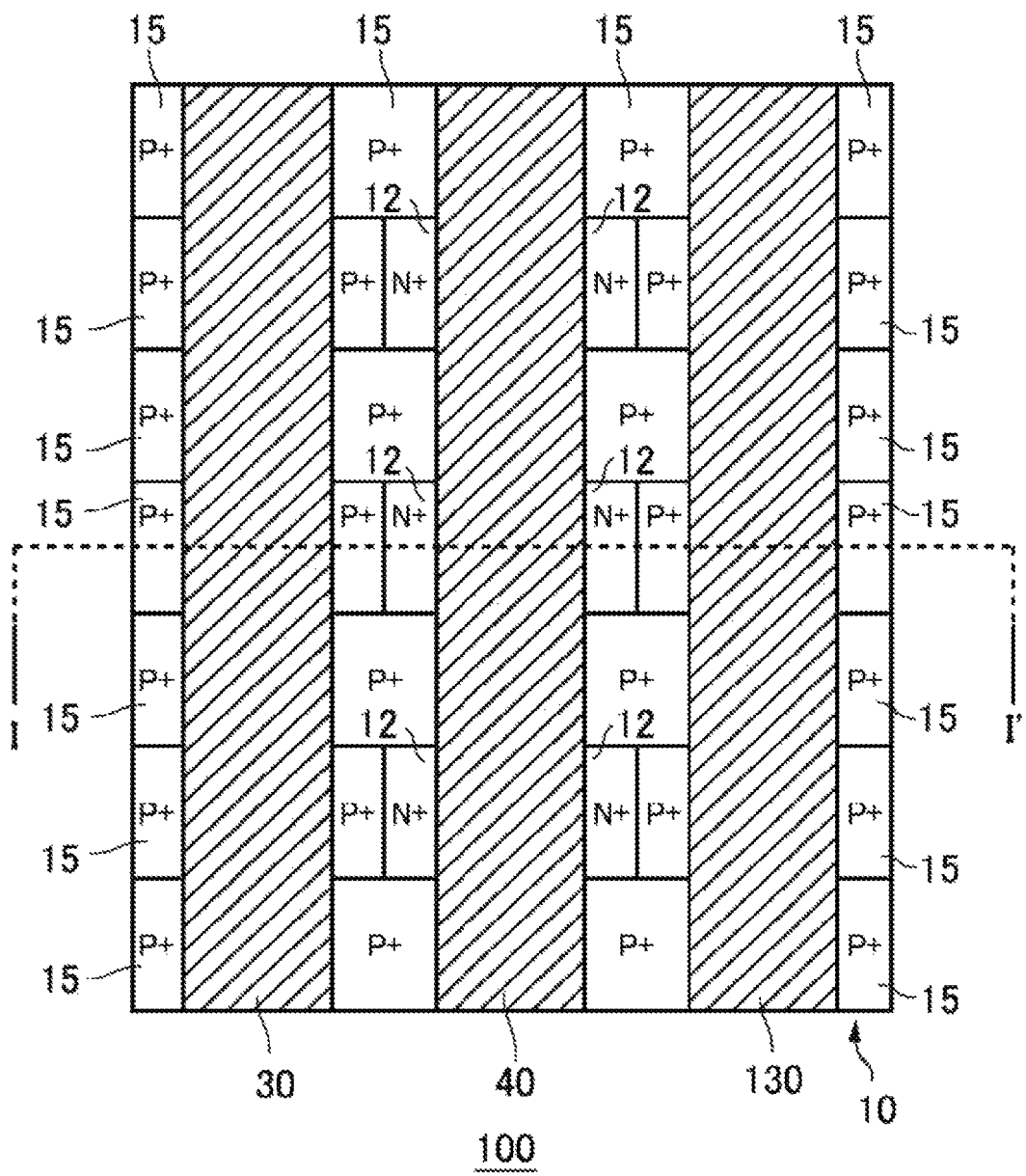
FIG. 9B shows another example of the top plan view of the three trench portions included in the semiconductor device 100.

FIG. 9B shows another example of the top plan view of the three trench portions included in the semiconductor device 100. As an example, FIG. 9A corresponds to cross section I-I' of FIG. 9B.

In this example, the emitter non-contact trench portion 130 and the dummy trench portion 30 are provided in contact with the contact region 15. The emitter contact trench portion 40 is provided in alternate contact with emitter region 12 and contact region 15.

That is, for the mesa portion of this example, the dummy trench portion 30 is disposed on the negative side of the emitter contact trench portion 40 in the X axis direction, and the emitter region 12 and the contact region 15 are provided as in FIG. 4B. On the other hand, the emitter non-contact trench portion 130 is disposed on the positive side of the emitter contact trench portion 40 in the X axis direction, and the emitter region 12 and the contact region 15 are provided as in FIG. 3B.

Figure 10A:
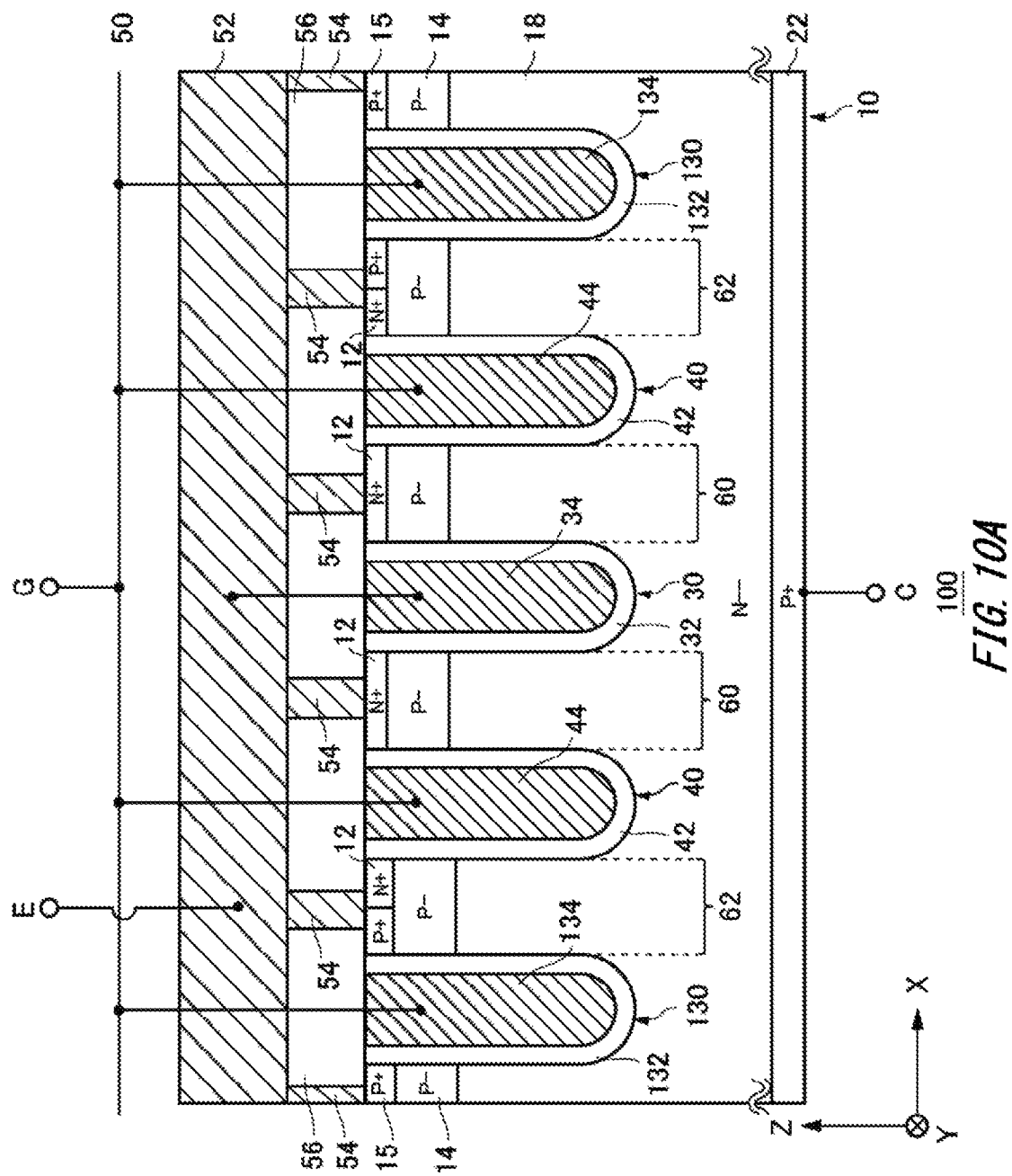
FIG. 10A shows an example of a cross-sectional view of five trench portions included in the semiconductor device 100.

FIG. 10A shows an example of a cross-sectional view of five trench portions included in the semiconductor device 100. In this example, in order from the negative side in the X direction to the positive side in the X direction, the emitter non-contact trench portion 130, the emitter contact trench portion 40, the dummy trench portion 30, the emitter contact trench portion 40, and the emitter non-contact trench portion 130 are arranged.

Figure 10B:
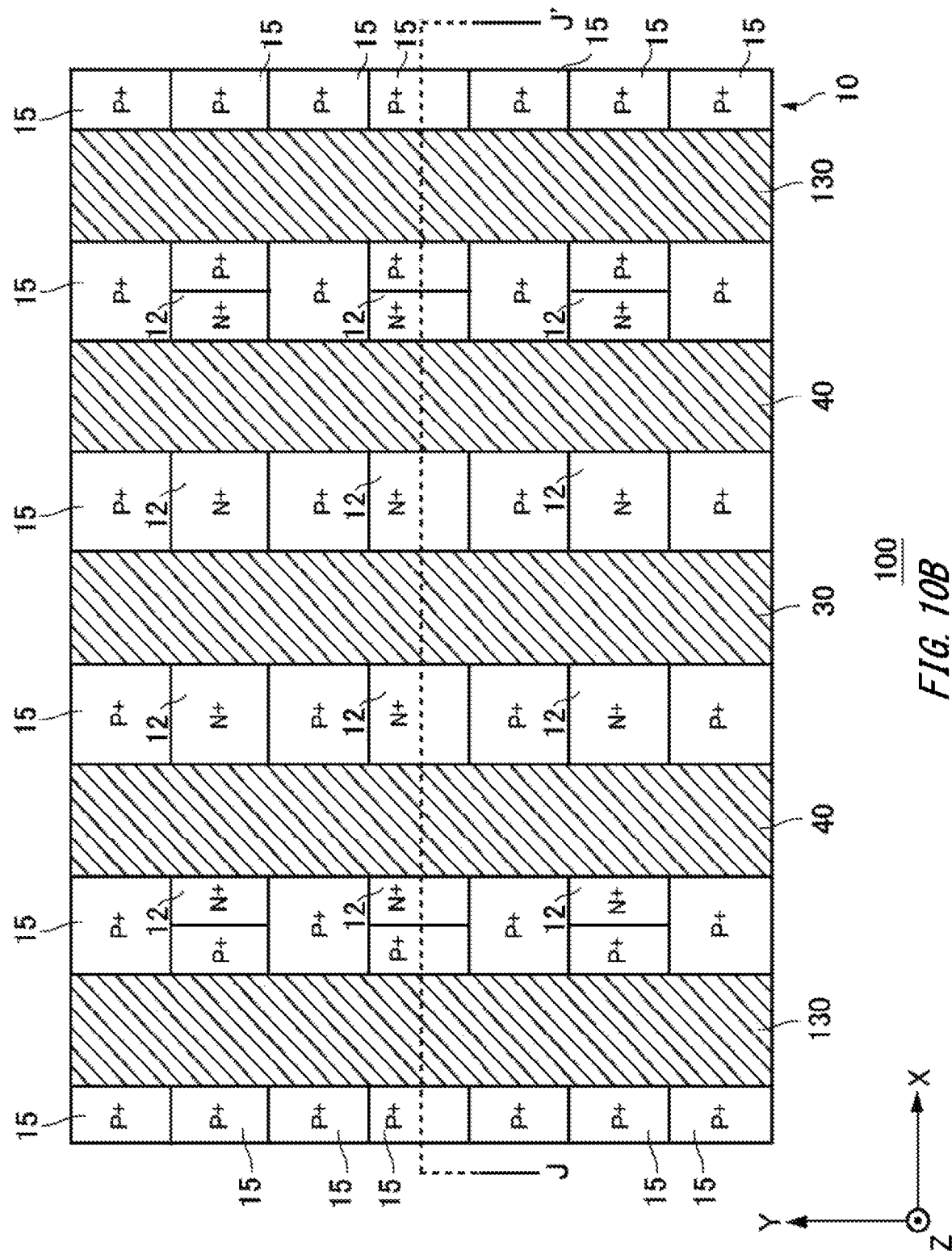
FIG. 10B shows an example of a top plan view of the five trench portions included in the semiconductor device 100.

FIG. 10B shows an example of a top plan view of the five trench portions included in the semiconductor device 100. As an example, FIG. 10A corresponds to cross section J-J' of FIG. 10B.

The emitter region 12 extends, in the negative direction of the X axis, from the emitter contact trench portion 40 disposed on the negative side in the X axis direction, and terminates between the emitter contact trench portion 40 and the emitter non-contact trench portion 130. The emitter region 12 extends from the emitter contact trench portion 40 on the negative side in the X axis direction to the dummy trench portion 30, and extends from the dummy trench portion 30 to the emitter contact trench portion 40 disposed on the positive side in the X axis direction. Further, the emitter region 12 extends, in the positive direction of the X axis, from the emitter contact trench portion 40 disposed on the positive side in the X axis direction, and terminates between the emitter contact trench portion 40 and the emitter non-contact trench portion 130.

Therefore, by setting a position where the emitter non-contact trench portion 130 is provided to be an end portion of the semiconductor substrate 10, it is possible to extend the emitter region 12 in the X axis direction. In a case where each trench portion is provided after the emitter region 12 is provided, it is possible to continuously provide the emitter region 12, and to simplify a process of providing the emitter region 12.

Figure 11A:
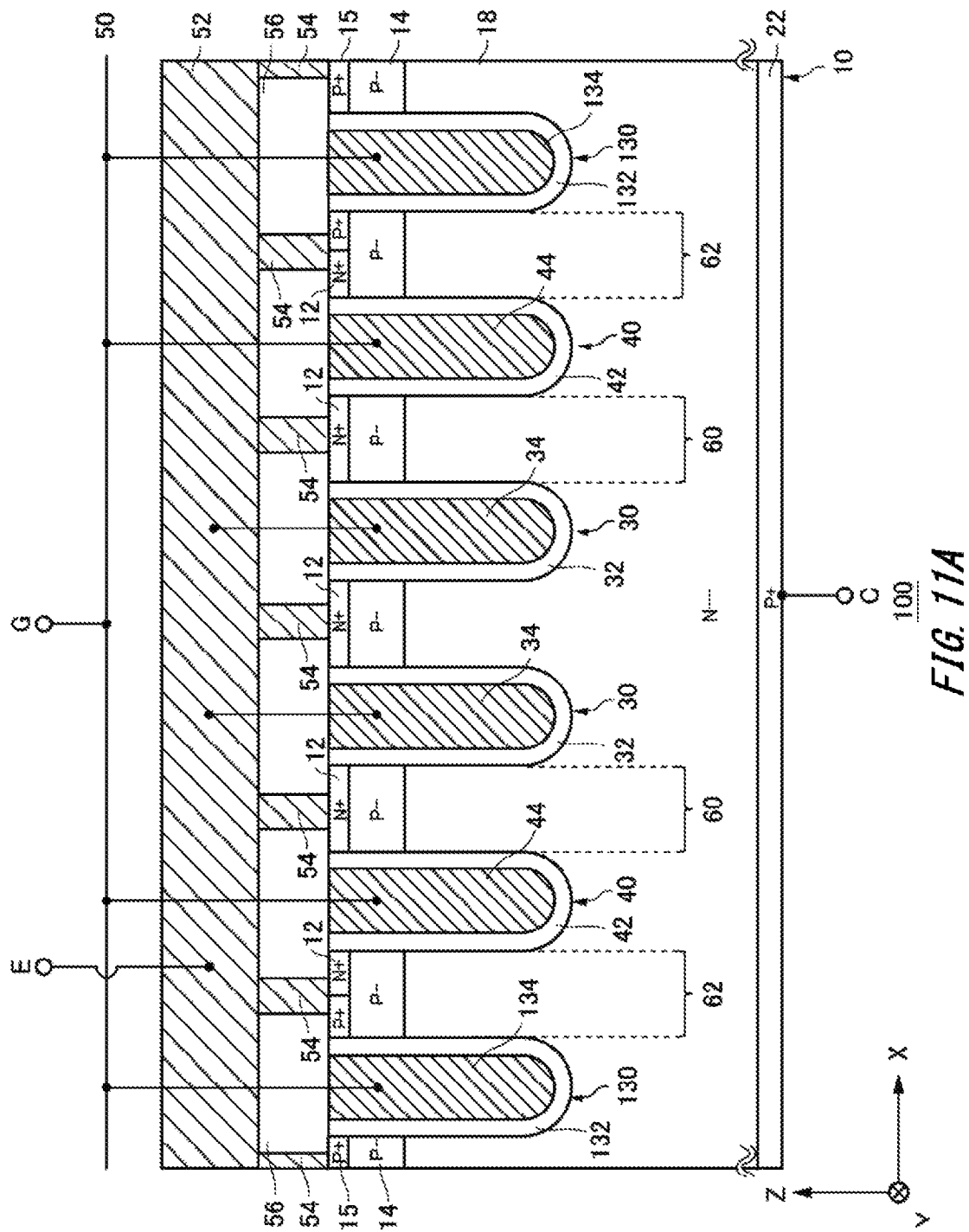
FIG. 11A shows an example of a cross-sectional view of six trench portions included in the semiconductor device 100.

FIG. 11A shows an example of a cross-sectional view of six trench portions included in the semiconductor device 100. In order from the negative side in the X axis direction, the six trench portions are the emitter non-contact trench portion 130, the emitter contact trench portion 40, the dummy trench portion 30, the dummy trench portion 30, the emitter contact trench portion 40, and the emitter non-contact trench portion 130.

Figure 11B:
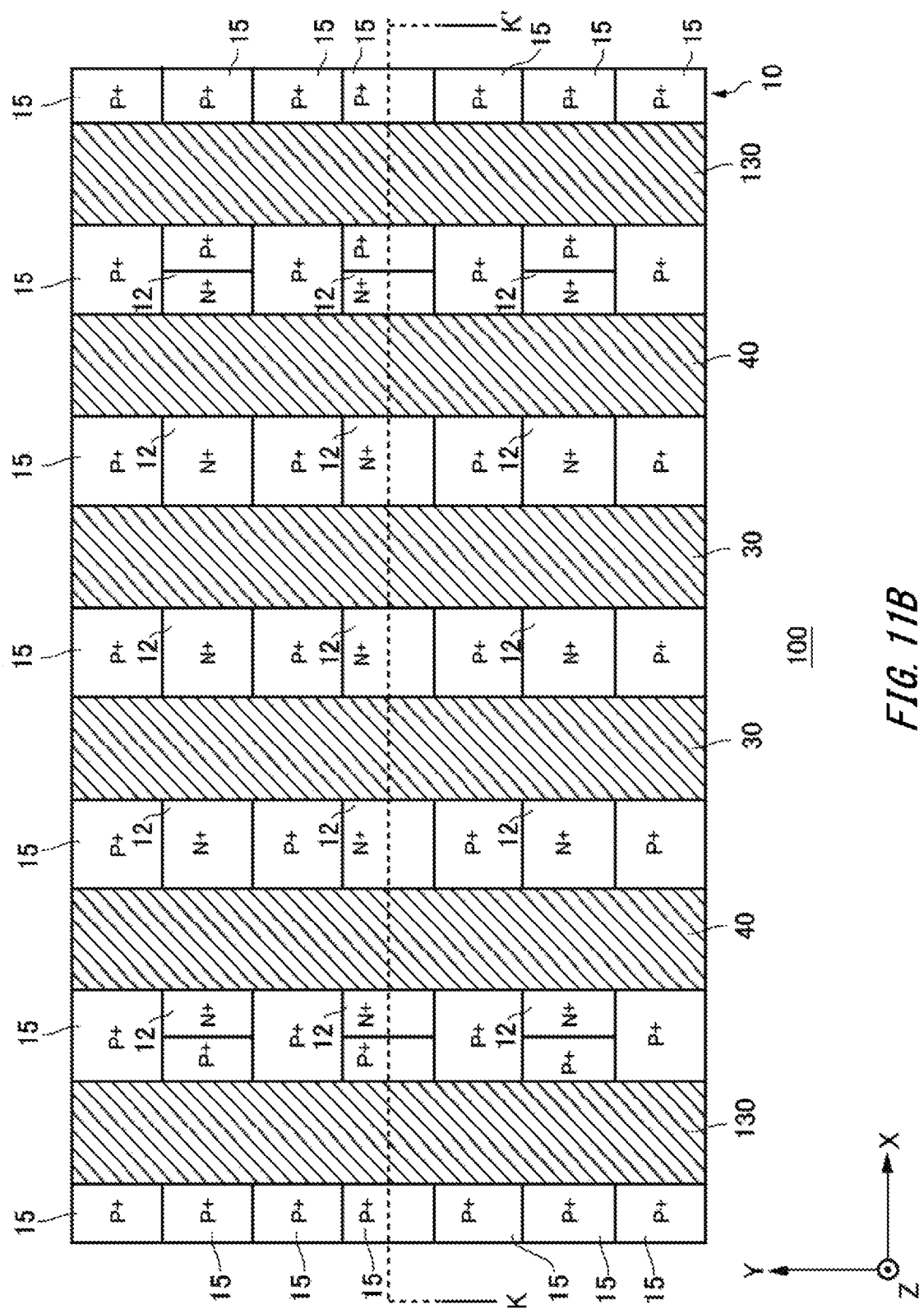
FIG. 11B shows an example of a top plan view of the six trench portions included in the semiconductor device 100.

FIG. 11B shows an example of a top plan view of the six trench portions included in the semiconductor device 100. As an example, FIG. 11A corresponds to cross section K-K' of FIG. 11B. In the example of FIG. 11B as well, the emitter region 12 extends from between the emitter non-contact trench portion 130 and the emitter contact trench portion 40 on the negative side in the X axis direction, to between the emitter contact trench portion 40 and the emitter non-contact trench portion 130 on the positive side in the X axis direction.

Figure 12A:
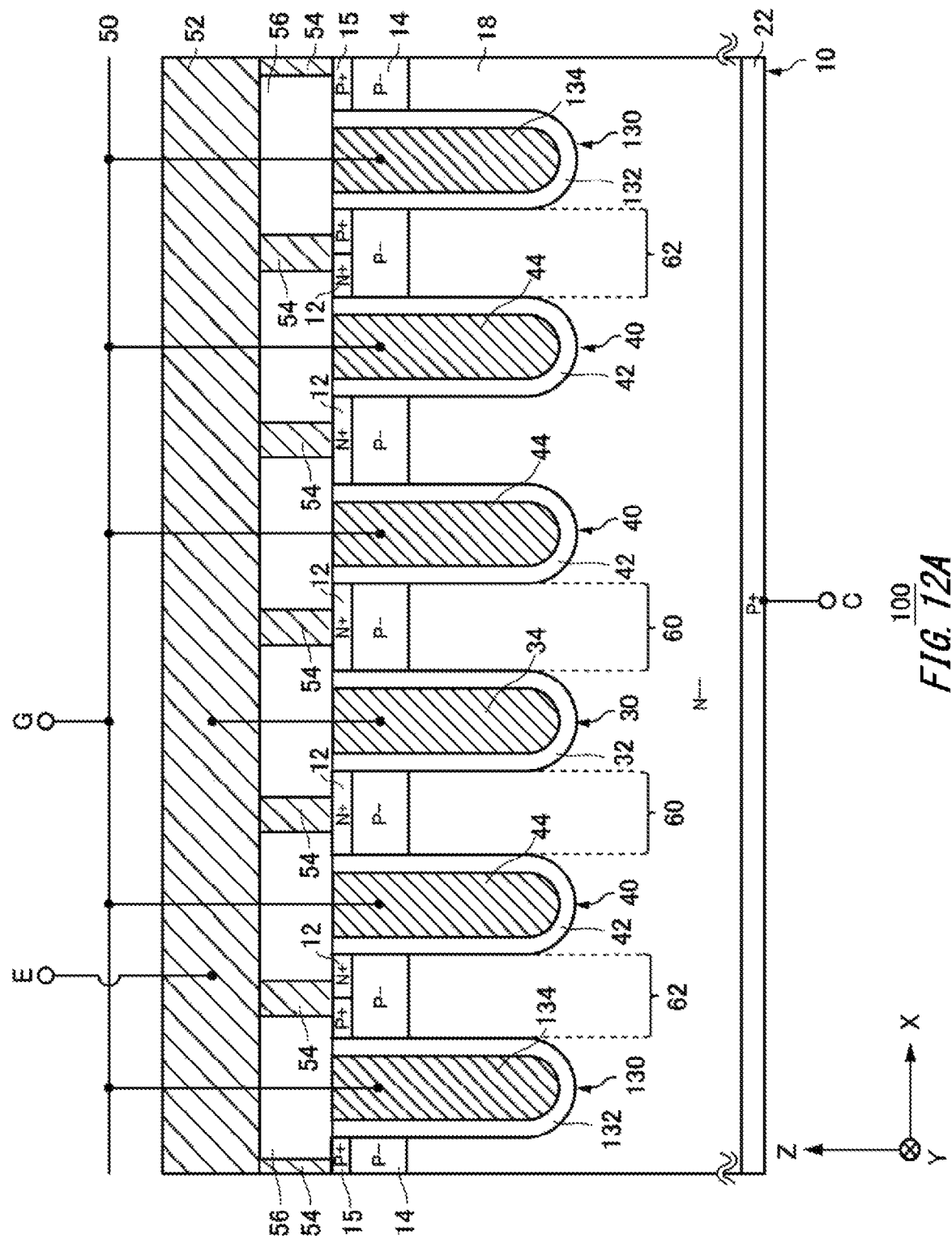
FIG. 12A shows another example of the cross-sectional view of the six trench portions included in the semiconductor device 100.

FIG. 12A shows another example of the cross-sectional view of the six trench portions included in the semiconductor device 100. In order from the negative side in the X axis direction, the six trench portions are the emitter non-contact trench portion 130, the emitter contact trench portion 40, the dummy trench portion 30, the emitter contact trench portion 40, the emitter contact trench portion 40, and the emitter non-contact trench portion 130. As in this example, the trench portions provided in the semiconductor device 100 may be asymmetrically arranged in the negative direction in the X axis direction and the positive direction in the X axis direction.

One of two trench portions adjacent to the emitter contact trench portion 40, the emitter contact trench portion 40 being a second trench portion when counting from the negative side in the X direction in this example, is the emitter non-contact trench portion 130 and the other is the dummy trench portion 30. The semiconductor device 100 only needs to have at least one mesa portion 62 between the emitter contact trench portion 40 and the emitter non-contact trench portion 130 and at least one mesa portion 60 between emitter contact trench portion 40 and dummy trench portion 30. The number of other trench portions is determined by a desired turn-on waveform of the semiconductor device 100 relating to a desired current density, collector current value, and collector voltage value or the like.

For example, the semiconductor device 100 may include a structure in which, for the trench portions adjacent to the emitter contact trench portion 40, one is the dummy trench portion 30 in contact with the emitter region 12 and the other is another emitter contact trench portion 40, as is the case with a fourth trench portion when counting from the negative side in the X direction. Alternatively, the semiconductor device 100 may include a structure in which, for the trench portions adjacent to the emitter contact trench portion 40, one is the emitter non-contact trench portion 130 and the other is another emitter contact trench portion 40, as is the case with a fifth trench portion when counting from the negative side in the X direction. Alternatively, the semiconductor device 100 may include a structure in which, for the trench portions adjacent to the emitter contact trench portion 40, both are the emitter non-contact trench portions 130.

Figure 12B:
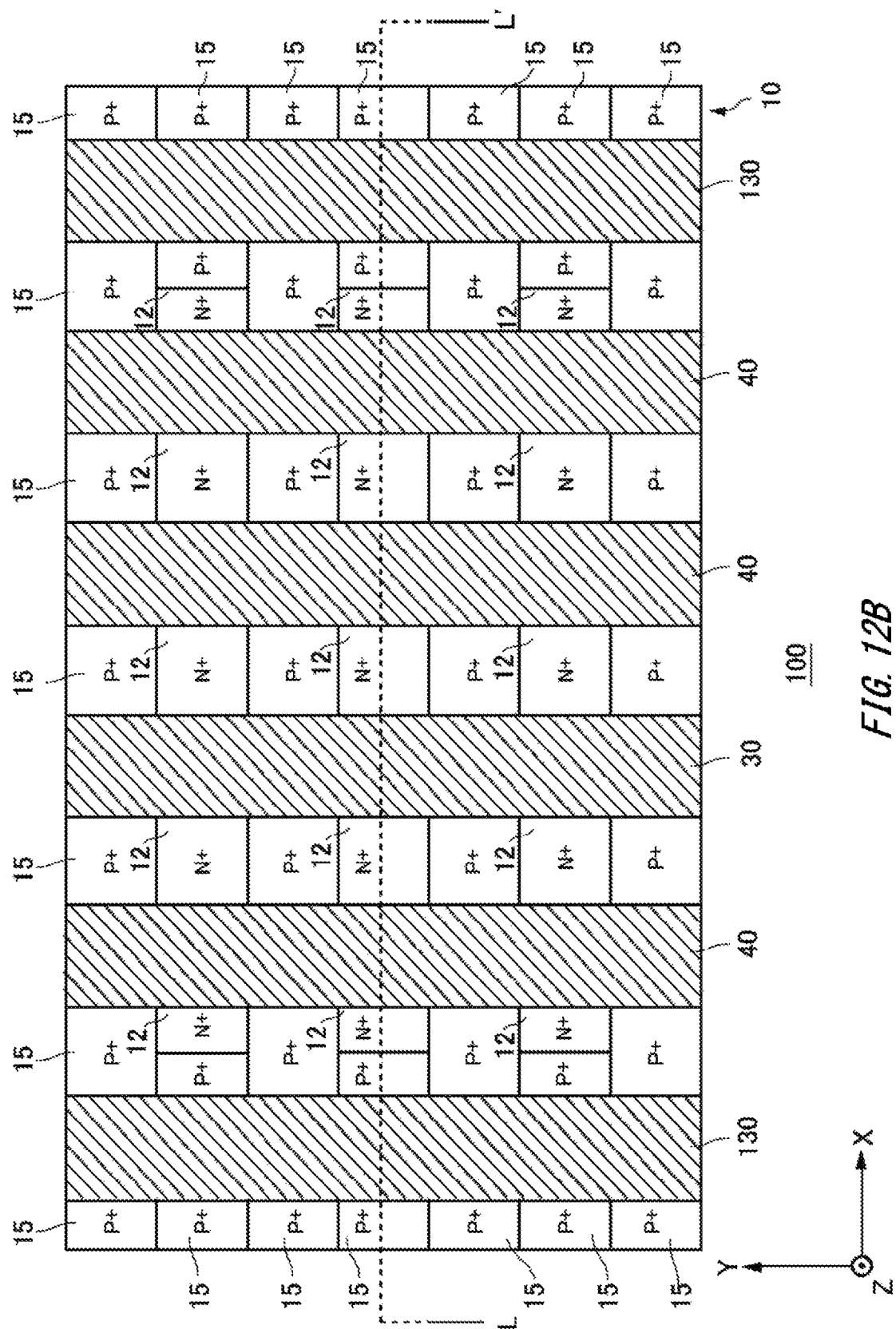
FIG. 12B shows another example of the top plan view of the six trench portions included in the semiconductor device 100.

FIG. 12B shows another example of the top plan view of the six trench portions included in the semiconductor device 100. As an example, FIG. 12A corresponds to cross section L-L' of FIG. 12B. A disposition of the diffusion region in the mesa portion of this example is the same as the disposition of FIG. 9B. Note that the disposition of the diffusion region on the front surface of the semiconductor substrate 10 may be different from the disposition of FIG. 9B as long as the emitter contact trench portion 40 is in contact with the emitter region and the emitter non-contact trench portion 130 is not in contact with the emitter region 12.

Figure 13A:
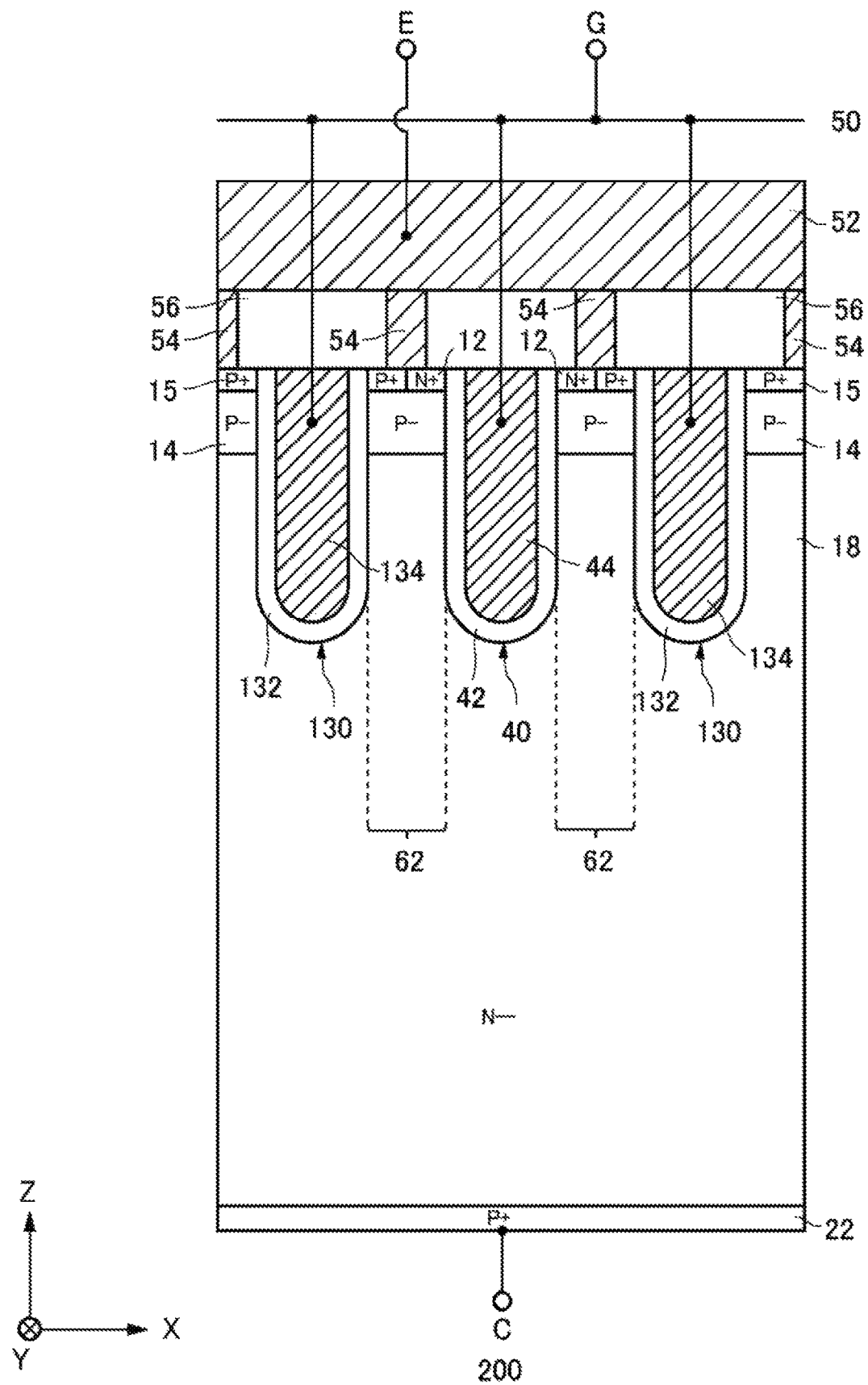
FIG. 13A shows an example of a cross-sectional view of three trench portions included in a semiconductor device 200 according to Comparative Example 1.

FIG. 13A shows an example of a cross-sectional view of three trench portions included in a semiconductor device 200 according to Comparative Example 1. The trench portions according to Comparative Example 1 include the two emitter non-contact trench portions 130 and the emitter contact trench portion 40 interposed therebetween.

Unlike the semiconductor device 100, the semiconductor device 200 does not have the dummy trench portion 30. That is, in the semiconductor device 200, the mesa portion in contact with the emitter contact trench portion 40 is solely the mesa portion 62 provided between the emitter non-contact trench portion 130 and the emitter contact trench portion 40. There is no difference in the duration of the switching time and turn-on timing between the mesa portions 62 in the semiconductor device 200.

Figure 13B:
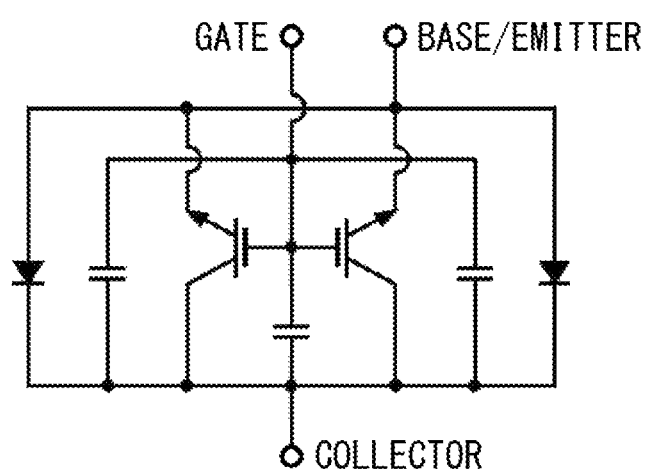
FIG. 13B is a circuit diagram of an equivalent circuit of the semiconductor device 200 according to Comparative Example 1.

FIG. 13B shows a circuit diagram of an equivalent circuit of the semiconductor device 200 according to Comparative Example 1. The emitter contact trench portion 40 and the emitter non-contact trench portion 130 are set to the gate potential.

In a case where the emitter contact trench portion 40 and the emitter non-contact trench portion 130 are set to the gate potential when the semiconductor device 200 is turned on, these trench portions act as parasitic capacitors. When the semiconductor device 200 is driven, three parasitic capacitors connected to the gate terminal in the equivalent circuit are charged to the gate potential.

The turn-on timing of the semiconductor device 200 comes after the charging of the parasitic capacitors. Therefore, the turn-on timing of the semiconductor device 200 is later than that of the semiconductor device having the dummy trench portion 30.

At the interface of the base region 14 in contact with the emitter contact trench portion 40, the N type channel is generated, and at the interface of the base region 14 in contact with the emitter non-contact trench portion 130, no channel is generated; however, electrons are attracted. Therefore, the carriers in the mesa portion 62 of the semiconductor device 200 are mainly electrons, and the semiconductor device 200 is driven by the current which is mainly the electron current. Since a mass of an electron is smaller than that of a hole, the switching time is short.

Figure 14A:
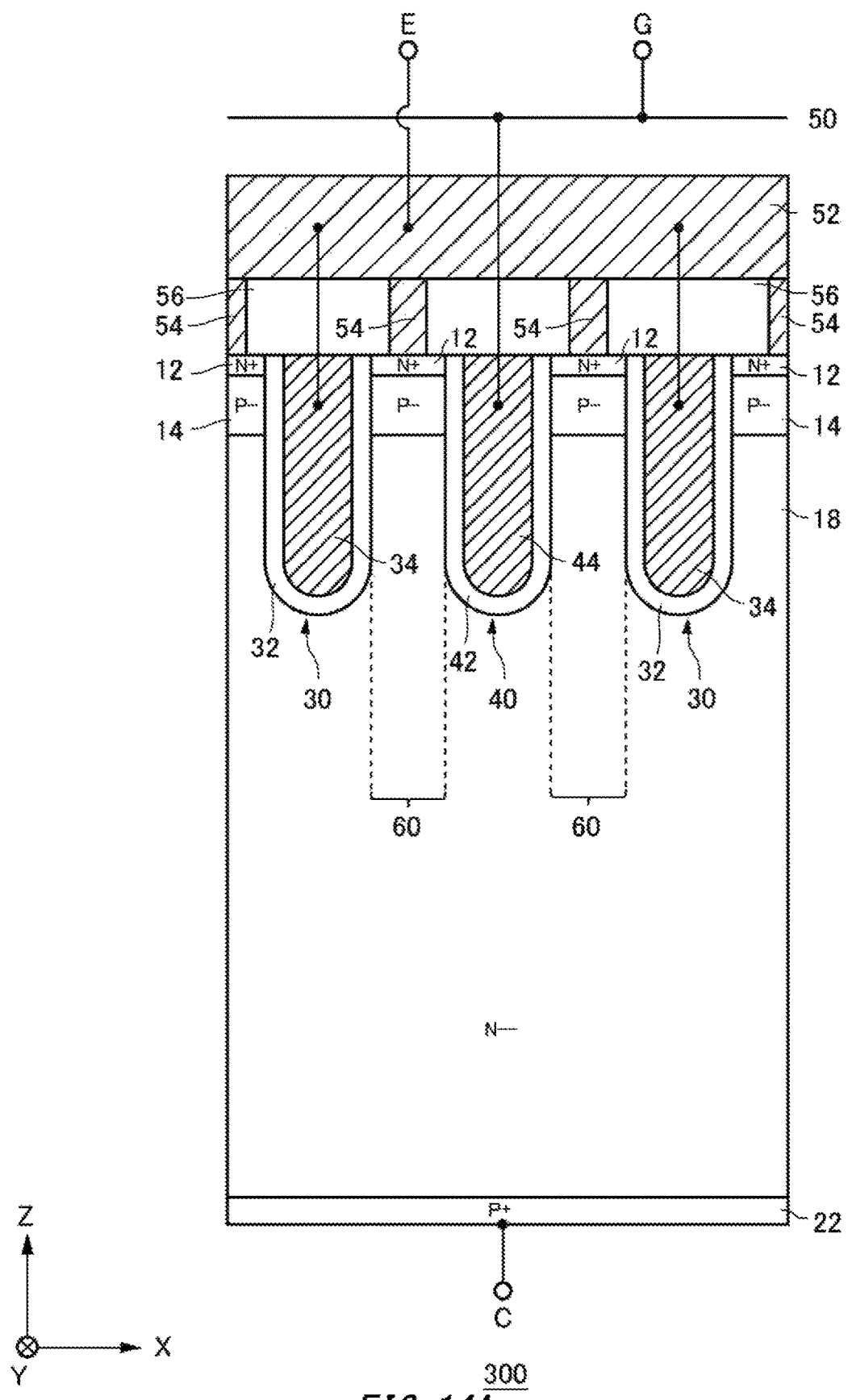
FIG. 14A shows an example of a cross-sectional view of three trench portions included in a semiconductor device 300 according to Comparative Example 2.

FIG. 14A shows an example of a cross-sectional view of three trench portions included in a semiconductor device 300 according to Comparative Example 2. The trench portions according to Comparative Example 2 include the two dummy trench portions 30 and the emitter contact trench portion 40 interposed therebetween.

Unlike the semiconductor device 100, the semiconductor device 300 does not have the emitter non-contact trench portion 130. That is, in the semiconductor device 300, the mesa portion in contact with the emitter contact trench portion 40 is solely the mesa portion 60 provided between the dummy trench portion 30 and the emitter contact trench portion 40. There is no difference in the duration of the switching time and turn-on timing between the mesa portions 60 in the semiconductor device 300.

On the front surface side of the semiconductor substrate of the semiconductor device 300 of Comparative Example 2, any of the three trench portions is in contact with the emitter region 12. The emitter contact trench portion 40 alone is connected to the gate terminal G and is set to the gate potential.

The dummy trench portion 30 is connected to the emitter electrode 52. The emitter electrode 52 is connected to the emitter terminal E and is set to the emitter potential. The emitter potential may be the ground potential.

Since the gate voltage is not applied to the dummy trench portion 30, electrons are not concentrated in the mesa portion 60 as much as in the mesa portion 62, the mesa portion 60 being between the dummy trench portion 30 and the emitter contact trench portion 40, the mesa portion 62 being between the emitter contact trench portion 40 and the emitter non-contact trench portion 130. Therefore, the switching time is longer in the mesa portion 60 than in the mesa portion 62 which is driven mainly by the electron current, the mesa portion 60 being between the emitter contact trench portion 40 and the dummy trench portion 30, the mesa portion 62 being between the emitter non-contact trench portion 130 and the emitter contact trench portion 40.

Figure 14B:
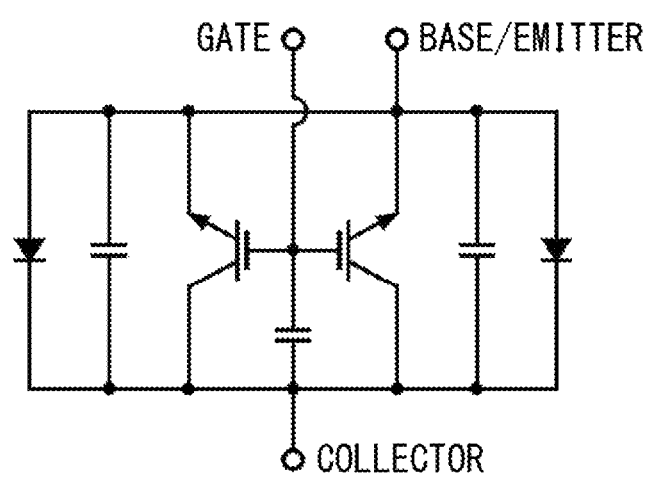
FIG. 14B shows a circuit diagram of an equivalent circuit of the semiconductor device 300 according to Comparative Example 2.

FIG. 14B shows a circuit diagram of an equivalent circuit of the semiconductor device 300 according to Comparative Example 2. As shown in the circuit diagram, the parasitic capacitor corresponding to the dummy trench portion 30 is set to the base-emitter potential and is not connected to the gate terminal.

When the gate voltage is applied to the gate of two transistors in the equivalent circuit to drive the two transistors, one parasitic capacitor connected to the gate only needs to be charged. The two transistors can cause the current to flow between the emitter and the collector without the charging of the parasitic capacitor of the dummy trench portion 30 connected in parallel to two diodes. In the semiconductor device 300, since the transistor can be driven merely by the charging of one parasitic capacitor, the turn-on timing is early.

Figure 15:
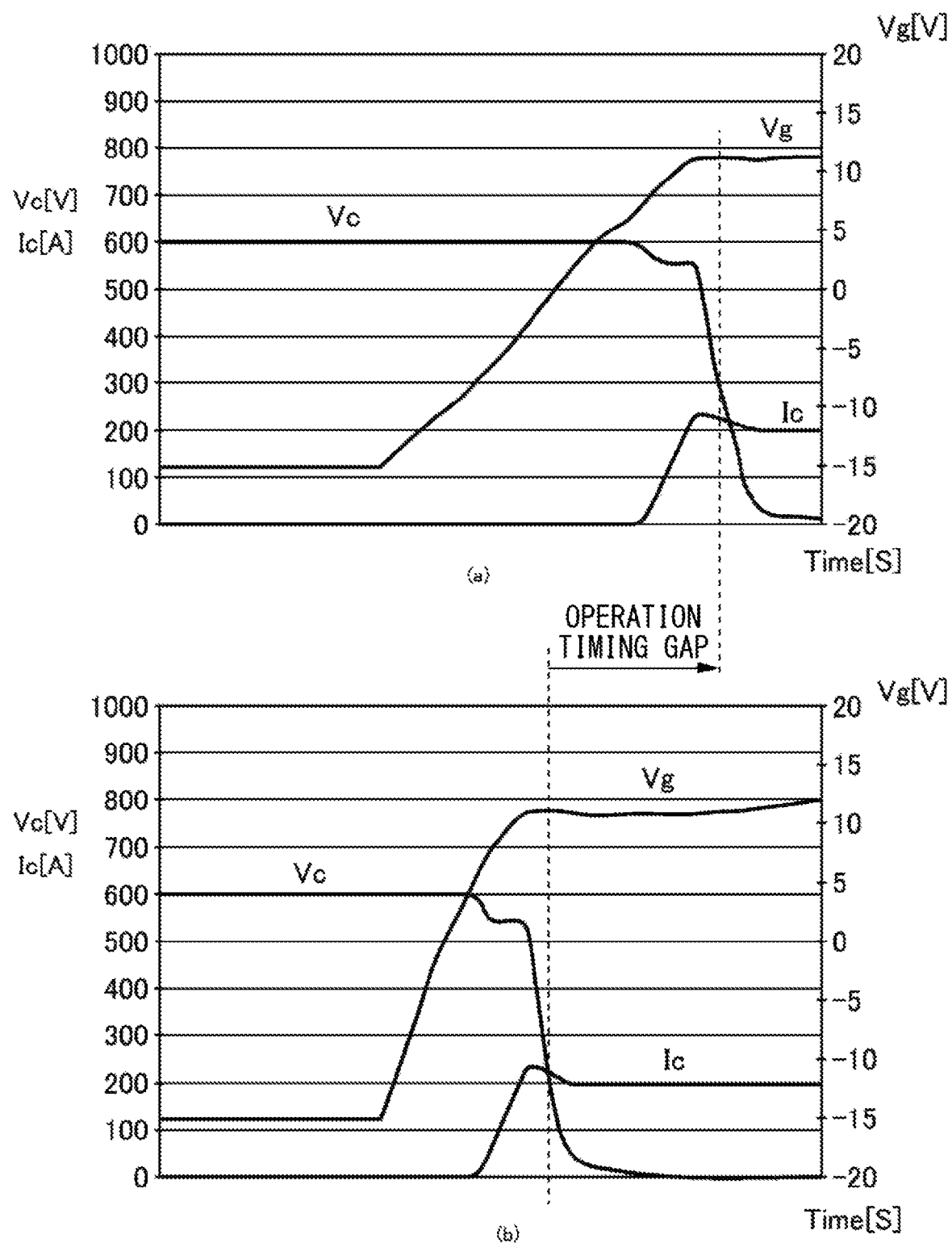

FIG. 15 shows temporal variations of currents and voltages when the trench portions according to Comparative Examples are turned on. A horizontal axis of a graph represents a time, and a vertical axis represents a voltage value (V) and a current value (A).

A graph (a) shows the temporal variations of the voltage and the current in the semiconductor device 200, and a graph (b) shows the temporal variations of the voltage and the current in the semiconductor device 300. The temporal variations of a gate voltage Vg, a collector voltage Vc, and a collector current Ic are shown. Between the semiconductor device 200 and the semiconductor device 300, there is a difference in turn-on timing and exists an operation timing gap.

Figure 16A:
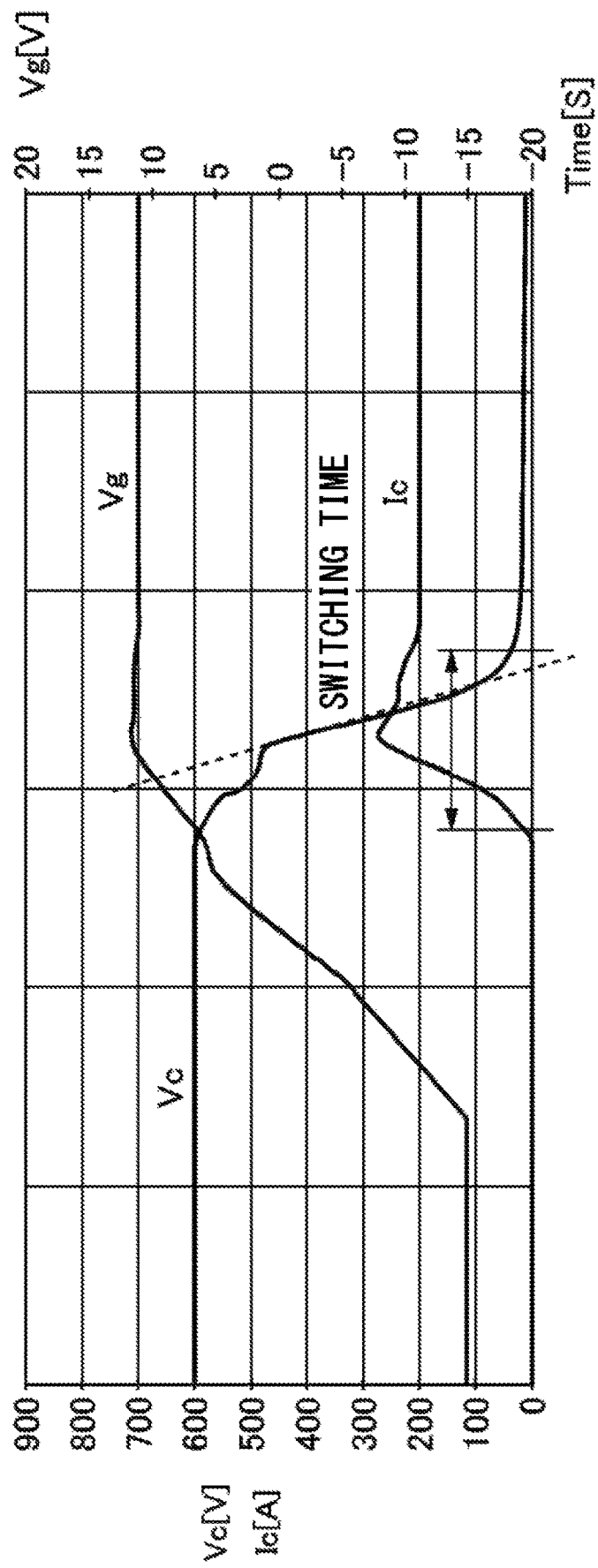

FIG. 16A shows temporal variations of a voltage and a current when the semiconductor device 200 is turned on. A gate resistance in this example is set to 7Ω. Since the semiconductor device 200 is turned on after the three parasitic capacitors are charged, the turn-on timing is late. On the other hand, the switching time after the charging of the parasitic capacitor is shorter in the semiconductor device 200 than in the semiconductor device having the dummy trench portion 30.

Figure 16B:
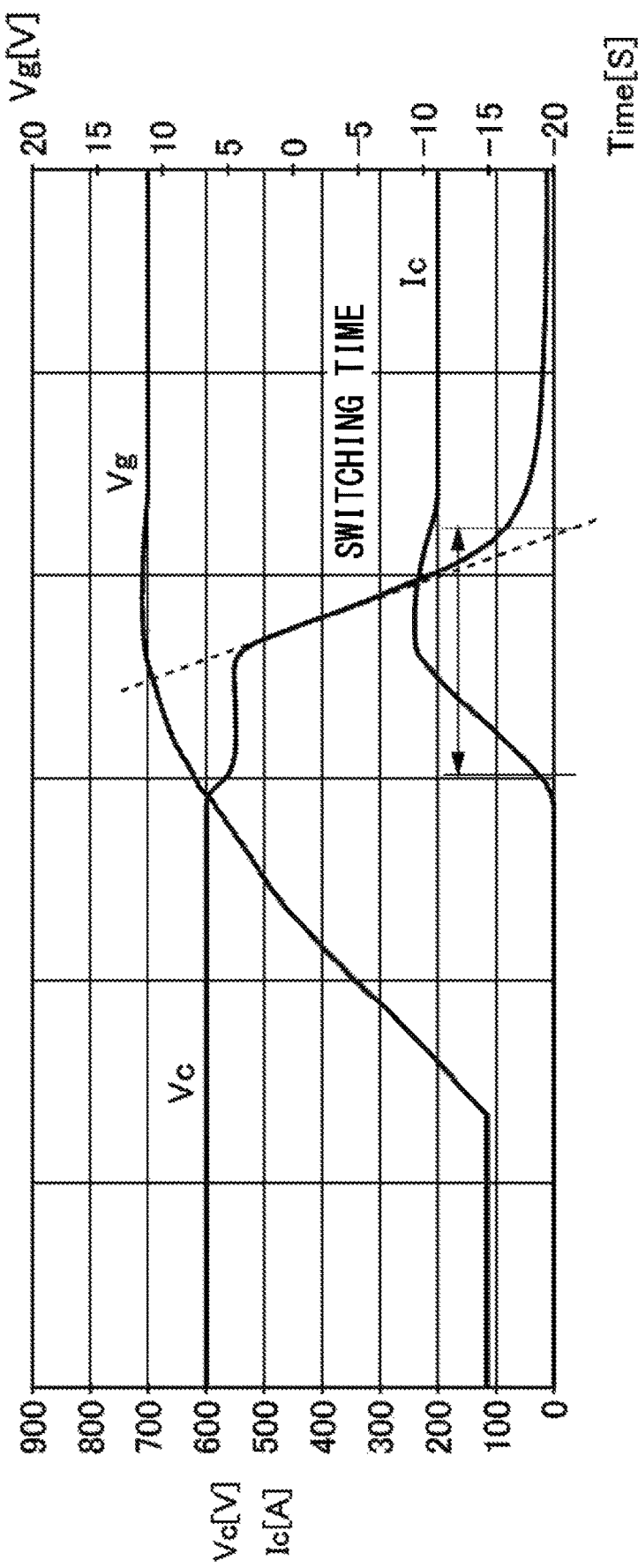

FIG. 16B shows temporal variations of a voltage and a current when the semiconductor device 300 is turned on. The gate resistance in this example is set to 20Ω. In the semiconductor device 300, unlike the semiconductor device 200, progress to the switching operation is possible merely by the charging of one parasitic capacitor. Therefore, the turn-on timing of the semiconductor device 300 is early. On the other hand, since a flow rate of the hole current is greater in semiconductor device 300 than in the semiconductor device 200, the switching time after the charging of the parasitic capacitor is long in the semiconductor device 300.

Figure 16C:
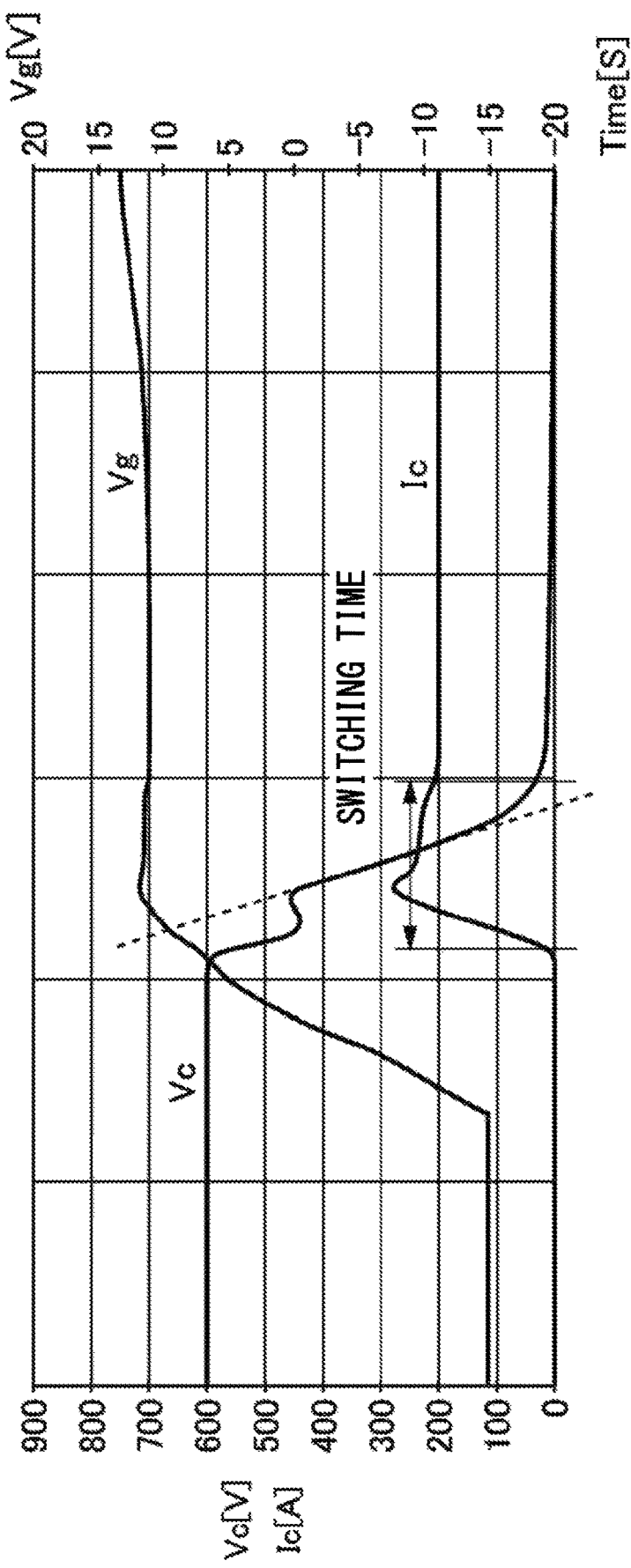

FIG. 16C shows temporal variations of a voltage and a current when the semiconductor device 100 is turned on. The gate resistance in this example is set to 5.5Ω.

In the semiconductor device 100, a stepwise switching operation is performed by a combination of the mesa portion 60 having a long switching time and the mesa portion 62 having a short switching time, the mesa portion 60 being between the dummy trench portion 30 and the emitter contact trench portion 40, the mesa portion 62 being between the emitter non-contact trench portion 130 and the emitter contact trench portion 40. A start timing of the switching operation of the semiconductor device 100 is earlier than that of the semiconductor device 200.

Further, in the semiconductor device 100, the switching operation is performed by the combination of the mesa portion 62 and the mesa portion 60, the mesa portion 62 in which the switching operation is performed mainly by the electron current, the mesa portion 60 having a greater flow rate of the hole current than that of the mesa portion 62. Accordingly, the switching time of the semiconductor device 100 is shorter than that of the semiconductor device 300.

In the semiconductor device 100, due to properties of the early turn-on timing and the short switching time, a slope of the temporal variation dV/dt of the voltage value at the collector voltage Vc is small. In a semiconductor device with the same gate resistance, the smaller the slope of dV/dt, the lower the turn-on loss of the semiconductor device.

Figure 17A:
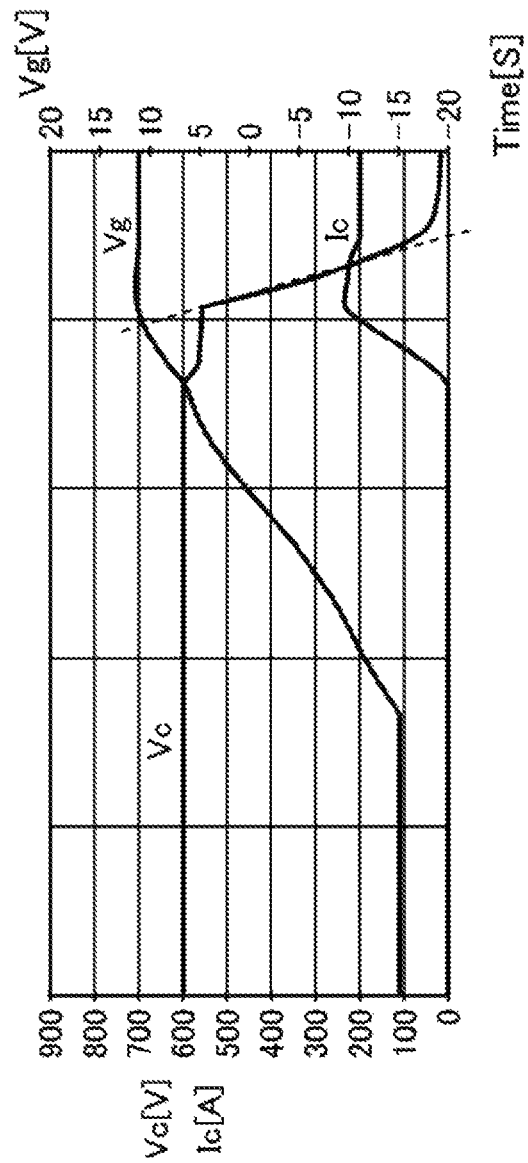
Figure 17A:
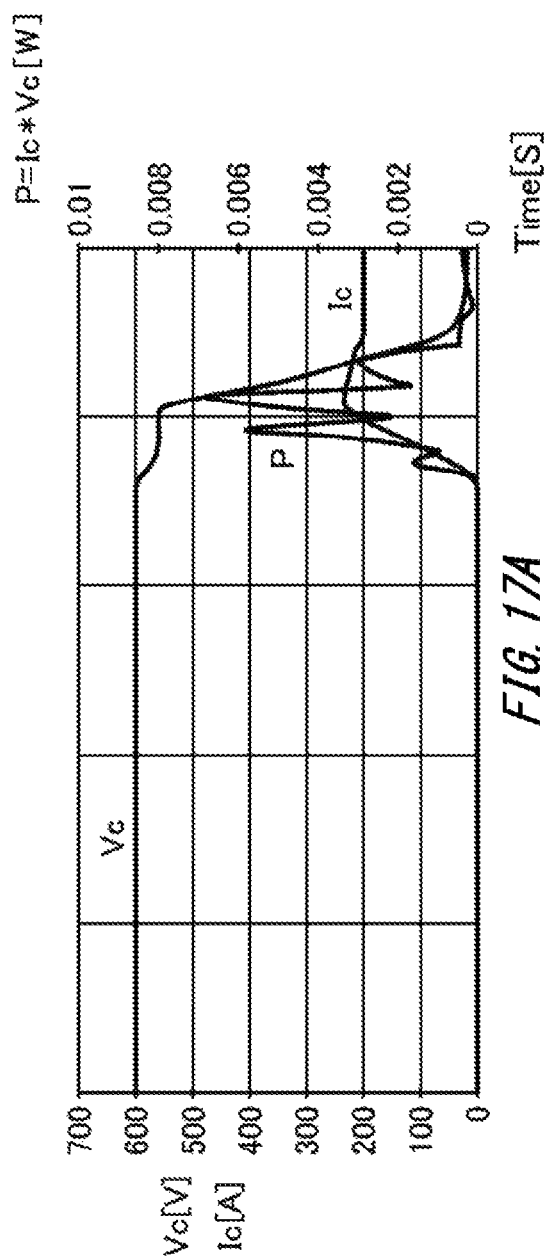

FIG. 17A shows temporal variations of a voltage and a current, and a turn-on loss when the semiconductor device 200 is turned on. By adjusting the gate resistance, the slope dV/dt of the temporal variation of the voltage at the collector voltage Vc during the switching time is adjusted to be equal to those in FIG. 17B and FIG. 17C which are described below. The gate resistance in this example is set to 20Ω.

P is an amount represented by a product of the collector voltage Vc and the collector current Ic. An area occupied by P corresponds to the turn-on loss.

Figure 17B:
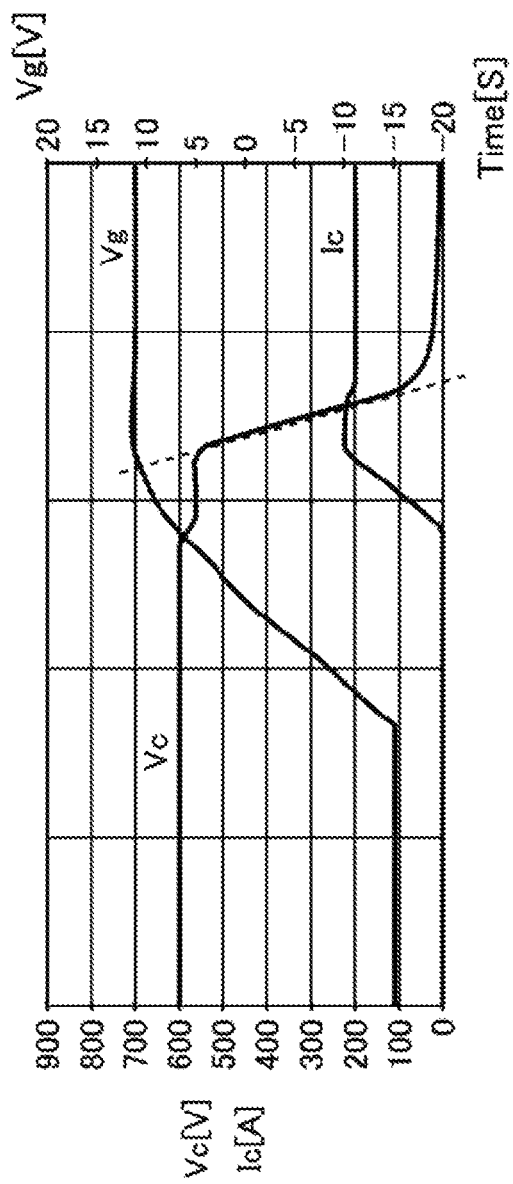
Figure 17B:
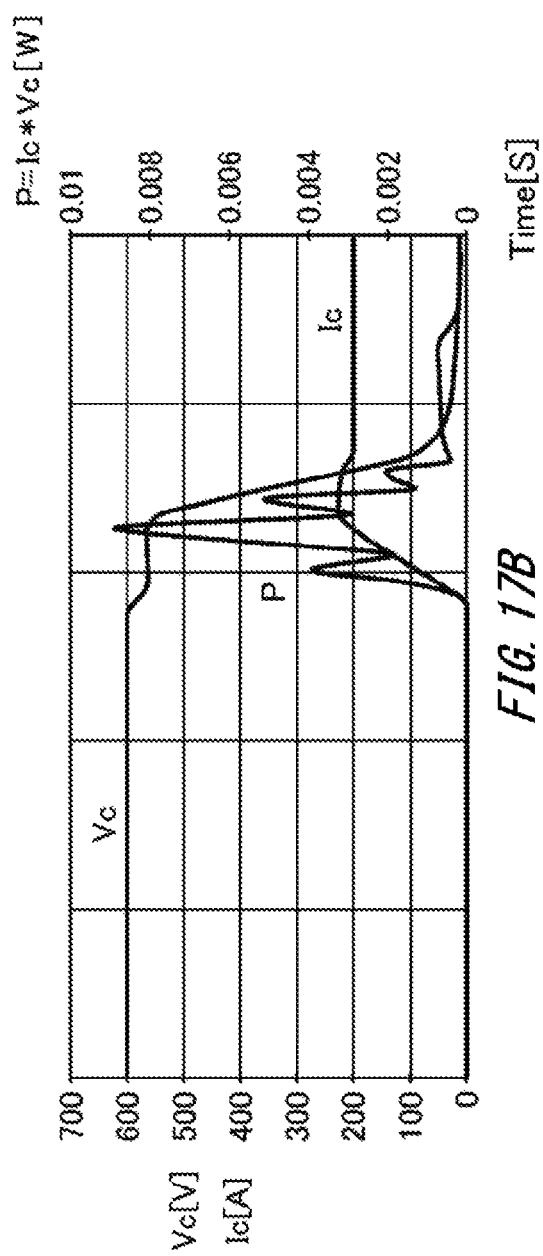

FIG. 17B shows temporal variations of a voltage and a current, and a turn-on loss when the semiconductor device 300 is turned on. By adjusting the gate resistance, the slope dV/dt of the temporal variation of the voltage at the collector voltage Vc during the switching time is adjusted to be equal to those in FIG. 17A, and FIG. 17C which is described below. The gate resistance in this example is set to 30Ω.

An area occupied by P in the semiconductor device 300 is greater than the area occupied by P in the semiconductor device 200. The turn-on loss is greater in the semiconductor device 300 having the dummy trench portion 30 than in the semiconductor device 200 having the emitter non-contact trench portion 130. This is because the switching time of the dummy trench portion 30 is longer than the switching time of the emitter non-contact trench portion 130.

Figure 17C:
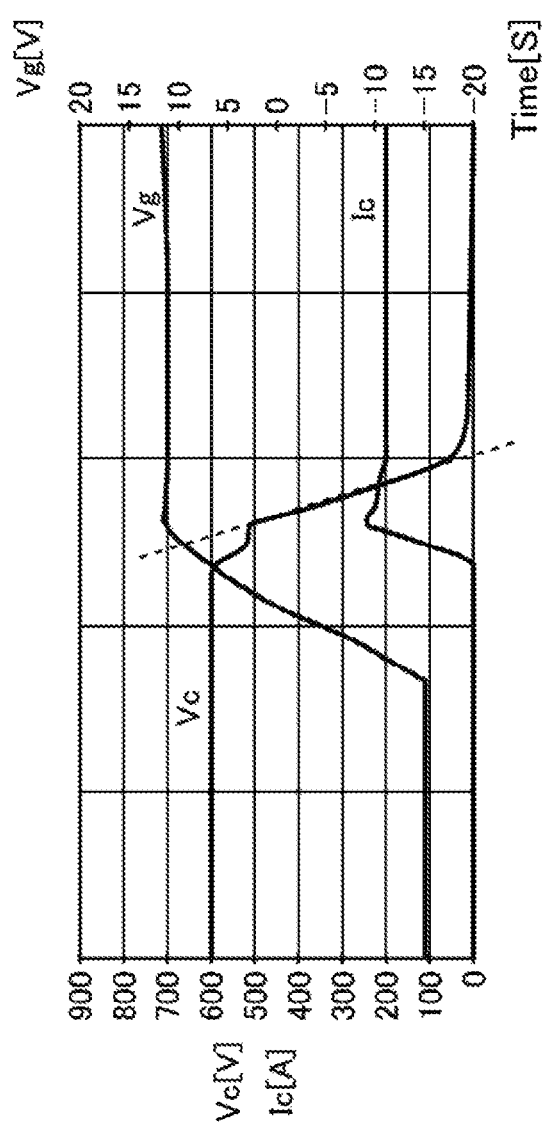
Figure 17C:
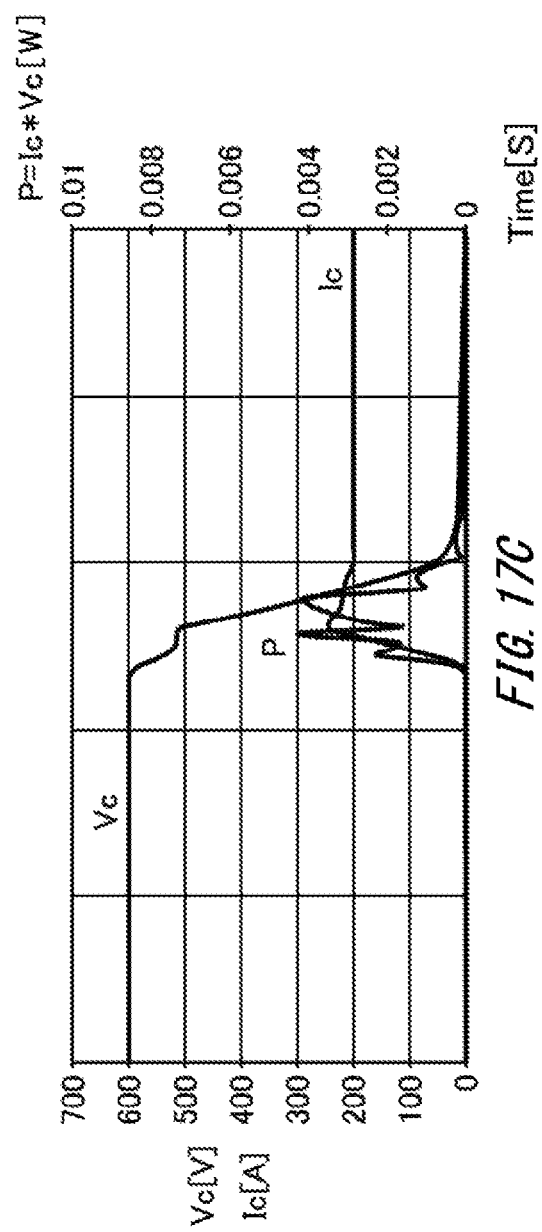

FIG. 17C shows temporal variations of a voltage and a current, and a turn-on loss when the semiconductor device 100 is turned on. By adjusting the gate resistance, the slope dV/dt of the temporal variation of the voltage at the collector voltage Vc during the switching time is adjusted to be equal to those in FIG. 17A and FIG. 17B. The gate resistance in this example is set to 10Ω.

An area occupied by P in the semiconductor device 100 is smaller than in any of the semiconductor device 200 and the semiconductor device 300. In the semiconductor device 100, it is possible to effectively reduce the turn-on loss by using the emitter non-contact trench portion 130 adjacent to the emitter contact trench portion 40, the emitter contact trench portion 40, and the dummy trench portion 30 adjacent to the emitter contact trench portion 40.

Figure 18:
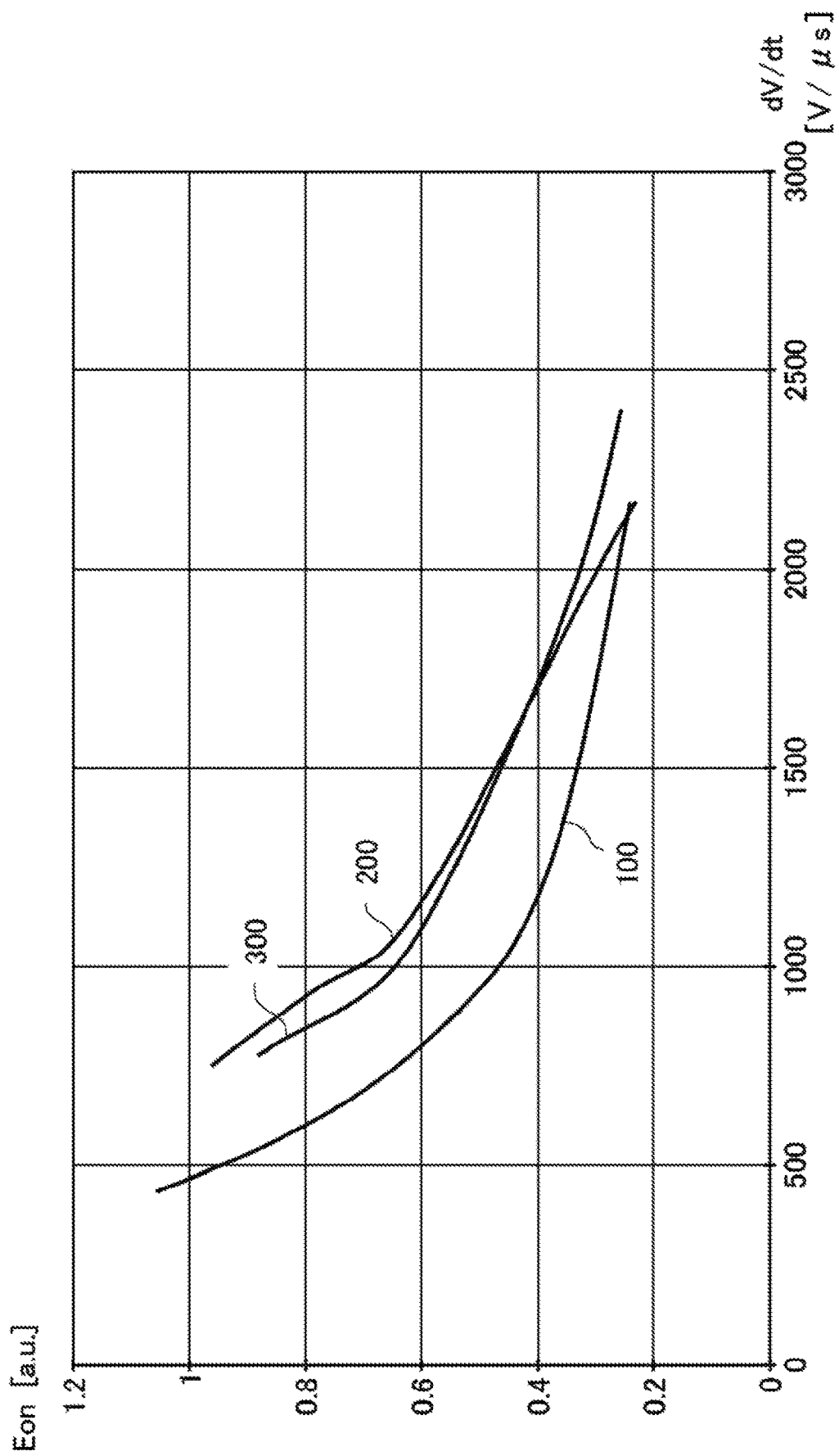

FIG. 18 shows a relationship between dV/dt and a switching loss Eon when the semiconductor device 100, the semiconductor device 200, and the semiconductor device 300 are turned on. The turn-on loss Eon in each semiconductor device, when the gate resistance is changed for dV/dt to be changed, is shown.

In the semiconductor device 100, the stepwise turn-on is performed by utilizing the difference in turn-on timing between the mesa portion 60 and the mesa portion 62, the mesa portion 60 being between the emitter contact trench portion 40 and the dummy trench portion 30, the mesa portion 62 being between the emitter contact trench portion 40 and the emitter non-contact trench portion 130. Further, since the switching time of the emitter non-contact trench portion 130 is short, the semiconductor device 100 has a smaller slope of dV/dt than the semiconductor device 300 merely using the dummy trench portion 30.

Therefore, the switching loss Eon of the semiconductor device 100 is reduced. Even when the value of the gate resistance is changed for the value of dV/dt to be changed, the semiconductor device 100 has a minimum turn-on loss at the same dV/dt, in comparison with the semiconductor device 200 and the semiconductor device 300.

Figure 19A:
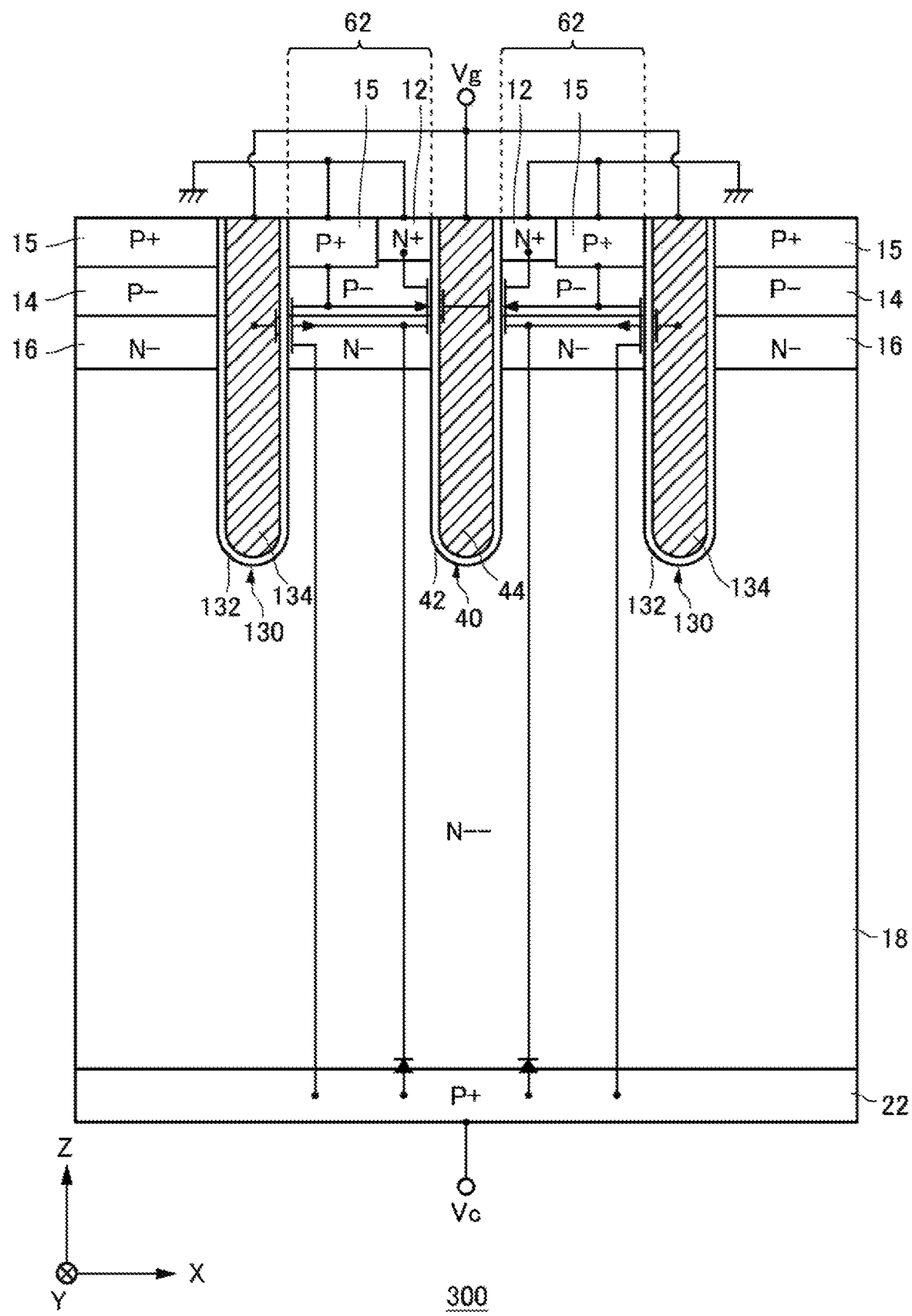
FIG. 19A shows an example of a cross-sectional view of an accumulation region 16 and three trench portions which are included in the semiconductor device 300.

FIG. 19A shows an example of a cross-sectional view of an accumulation region 16 and three trench portions which are included in the semiconductor device 300. The semiconductor device 300 of this example has, on the front surface of the semiconductor substrate, the two emitter non-contact trench portions 130 and the emitter contact trench portion 40, the emitter contact trench portion 40 being disposed in a interposed manner between the two emitter non-contact trench portions 130 and being adjacent to the two emitter non-contact trench portions 130.

The semiconductor substrate of the semiconductor device 300 has the emitter region 12 of the N+ type and the contact region 15 of the P+ type on the front surface. In this example, the emitter region 12 is divided by the contact region 15 between the emitter non-contact trench portion 130 and the emitter contact trench portion 40. The emitter non-contact trench portion 130 and the emitter contact trench portion 40 are both in contact with emitter region 12.

The semiconductor substrate of the semiconductor device 300 has the base region 14 of the P− type below and in contact with the emitter region 12 and the contact region 15. Further, the semiconductor substrate has the accumulation region 16 of the N− type below and in contact with the base region 14, the drift region 18 of the N−−type below and in contact with the accumulation region 16, and a collector region 22 of a P+ type below and in contact with the drift region 18.

In this example, on the front surface side of the semiconductor substrate, the emitter region 12 and the contact region 15 which are between the emitter non-contact trench portion 130 and the emitter contact trench portion 40 are set to the ground potential. The emitter contact trench portion 40, and the gate conductive portion 134 of the emitter non-contact trench portion 130 are connected to the gate terminal and is set to the gate potential. On the other hand, on the rear surface side of the semiconductor substrate, the collector region 22 is connected to the collector terminal C and is set to the collector potential.

During the turn-on operation, the N type channel is generated at the interface of the base region 14 in contact with the emitter contact trench portion 40. The emitter contact trench portion 40 and the diffusion region on the emitter contact trench portion 40 side operate as the NPN transistor.

When the collector potential Vc increases during the operation, the ground potential at the dummy trench portion 30 becomes a relatively low voltage. When the ground potential can be considered as a low potential, the accumulation region 16 of the N− type has the base region 14 of the P− type on the front surface side of the semiconductor substrate, and the collector region 22 of the P+ type on the rear surface side of the semiconductor substrate. Therefore, a PNP parasitic transistor is formed in a vicinity of the diffusion region in contact with the dummy trench portion 30.

As described above, when the accumulation region 16 is present, the semiconductor device 300 performs an operation of driving two transistors relating to the NPN transistor and a PNP parasitic transistor which has a high threshold. Accordingly, the semiconductor device 300 is driven stepwise in two steps in the switching operation.

Figure 19B:
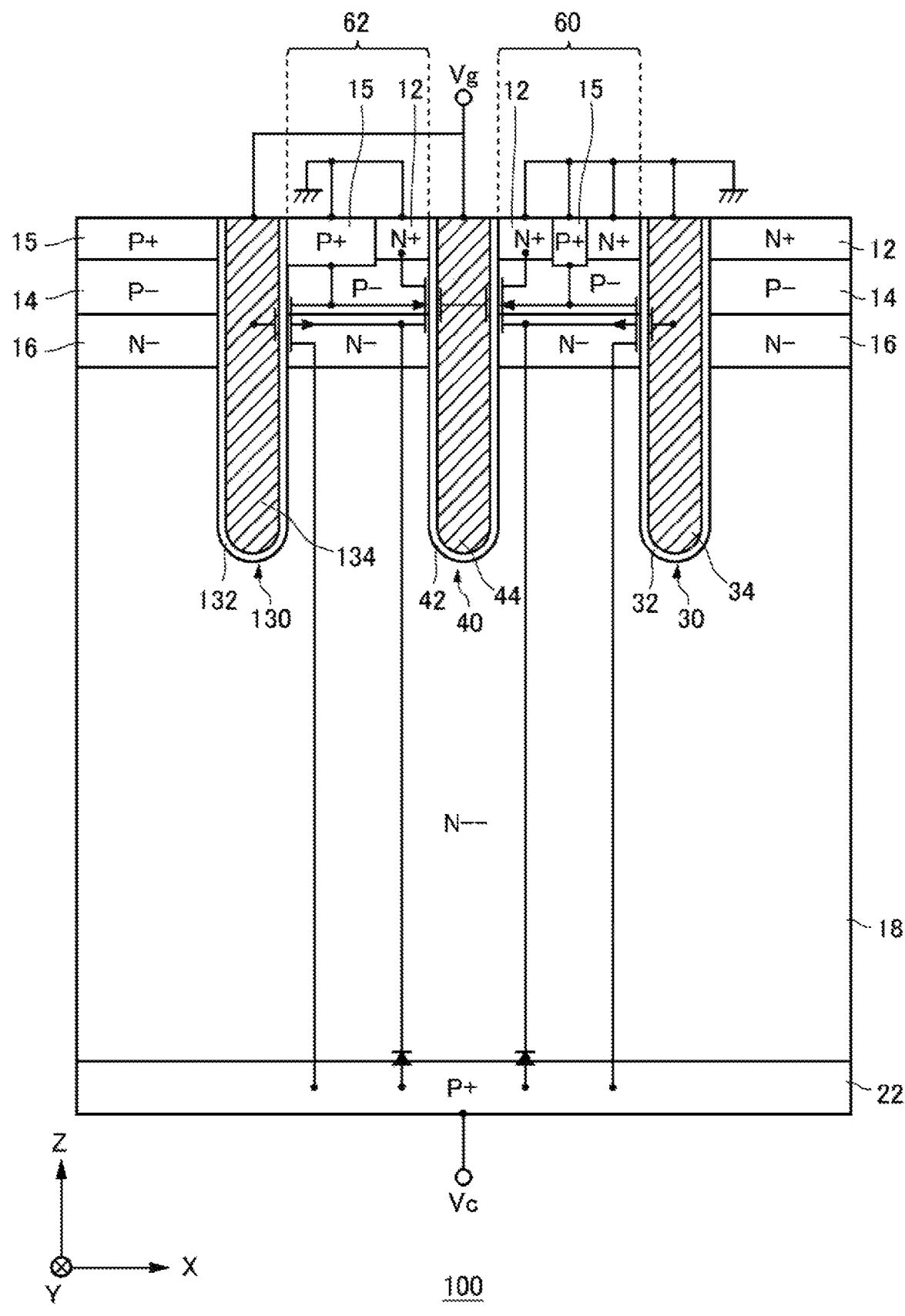
FIG. 19B shows an example of a cross-sectional view of the accumulation region 16 and three trench portions which are included in the semiconductor device 100.

FIG. 19B shows an example of a cross-sectional view of the accumulation region 16 and three trench portions which are included in the semiconductor device 100. From the positive side in the X axis direction, the dummy trench portion 30, the emitter contact trench portion 40, and a trench portion in which the positive side in the X axis direction operates as the emitter non-contact trench portion 130 are disposed. The semiconductor device 100 of this example also has the mesa portion 62 between the emitter non-contact trench portion 130 and the emitter contact trench portion 40, and the mesa portion 60 between the emitter contact trench portion 40 and the dummy trench portion 30.

The trench portion disposed on the negative side in the X axis direction is in contact with the emitter region 12 on the negative side in the X axis direction, and is in contact with the contact region 15 on the positive side in the X axis direction. That is, the trench portion operates as the emitter non-contact trench portion 130 on the negative side in the X axis direction, and operates as the emitter contact trench portion 40 on the positive side in the X axis direction.

The semiconductor device 100 of this example has the accumulation region 16 of the N− type below and in contact with the base region 14, and above and in contact with the drift region. Due to the differences in the duration of the switching time and turn-on timing between the mesa portion 62 and the mesa portion 60, the mesa portion 62 being between the emitter non-contact trench portion 130 and the emitter contact trench portion 40, the mesa portion 60 being between the dummy trench portion 30 and the emitter contact trench portion 40, the operation waveform of the semiconductor device 100 varies depending on a presence or an absence of the accumulation region 16.

In the mesa portion on the negative side of the emitter contact trench portion 40, an NPN transistor using the gate voltage Vg as a drive voltage is formed in the base region 14 in contact with the emitter contact trench portion 40. Correspondingly, also in the mesa portion on the positive side of the emitter contact trench portion 40, the NPN transistor using the gate voltage Vg as the drive voltage is formed in the base region 14 in contact with the emitter contact trench portion 40.

In the mesa portion on the negative side of the emitter contact trench portion 40, a PNP parasitic transistor using a drive voltage of (gate voltage Vg)–(collector voltage Vc) is formed in the accumulation region 16 in contact with the emitter non-contact trench portion 130. In this case, since the mesa portion 62 is interposed between the gate conductive portion 44 and the gate conductive portion 134 which are connected to the gate potential, the potential of the mesa portion 62 easily increases, and the PNP parasitic transistor is hardly turned on.

On the other hand, in the mesa portion on the positive side of the emitter contact trench portion 40, a PNP parasitic transistor using a drive voltage of—(collector voltage Vc) is formed in the accumulation region 16 in contact with the dummy trench portion 30. In this case, since the mesa portion 60 is interposed between the gate conductive portion 44 connected to the gate potential and the dummy conductive portion 34 connected to the emitter potential, the potential of the mesa portion 60 hardly increases, and the PNP parasitic transistor is easily turned on.

The semiconductor device 100 having the accumulation region 16 includes the NPN transistor and the PNP parasitic transistor which has the high threshold voltage. Accordingly, the mesa portion 60 between the dummy trench portion 30 and the emitter contact trench portion 40 operates in two stages. Further, the PNP parasitic transistor in the accumulation region 16 is driven by the hole current. Accordingly, the drive voltage Vc in a second step of the stepwise operation increases in the semiconductor device 100 as a whole.

FIG. 20A shows relationships, in semiconductor substrates having no accumulation region 16, between currents and voltages when the semiconductor device 100 and the semiconductor device 300 are turned on. With the vertical axis representing the current Ic between the emitter and the collector, and the horizontal axis representing the collector voltage Vc, the relationship between the current and the voltage at the time of turn-on is shown. Note that the gate voltage Vg applied to the gate terminal is commonly 6.1 V.

Any of the semiconductor device 100 and the semiconductor device 300 has the channel generated at the interface of the base region 14 in the vicinity of the emitter contact trench portion 40. Accordingly, the NPN transistor operates.

On the other hand, the semiconductor device 100 and the semiconductor device 300 of this example do not have the accumulation region 16. Therefore, the threshold voltage of the PNP parasitic transistor is low, and the PNP parasitic transistor is driven by the low collector voltage Vc.

With respect to a V-I diagram of the semiconductor device 300, the mesa portion in the semiconductor device 300 is solely the mesa portion 62 between the emitter contact trench portion 40 and the emitter non-contact trench portion 130. Accordingly, the amount of currents is limited unless the PNP parasitic transistor is turned on, and thus a rise due to the stepwise operation in two steps is shown.

On the other hand, with respect to the V-I diagram of the semiconductor device 100, the semiconductor device 100 has the mesa portion 60 between the dummy trench portion 30 and the emitter contact trench portion 40, and thus the PNP parasitic transistor is easily turned on, and the drive is performed almost simultaneously with the NPN parasitic transistor. Therefore, the stepwise rise is not seen.

FIG. 20B shows relationships, in semiconductor substrates having the accumulation regions 16, between currents and voltages when the semiconductor device 100 and the semiconductor device 300 are turned on. That is, the operation of the semiconductor device 300 corresponds to the operation of the semiconductor device in FIG. 19A, and the operation of the semiconductor device 100 corresponds to the operation of the semiconductor device in FIG. 19B.

Repeatedly, with the vertical axis representing the current Ic between the emitter and the collector, and the horizontal axis representing the collector voltage Vc, the relationship between the current and the voltage at the time of turn-on is shown. The gate voltage Vg applied to the gate terminal is commonly 6.1 V.

When there is the accumulation region 16, the PNP transistor which has the high threshold voltage is formed in the diffusion region in the vicinity of the dummy trench portion 30. Accordingly, in the I-V diagram of the semiconductor device 100 as well, the stepwise rise in two steps is performed in the drive operation.

With respect to the V-I diagram in the semiconductor device 300, the mesa portion in the semiconductor device 300 is solely the mesa portion 62 between the emitter contact trench portion 40 and the emitter non-contact trench portion 130. Accordingly, the threshold value of the PNP parasitic transistor further increases, and thus the collector voltage Vc to turn on increases. Therefore, the rise due to the stepwise operation in two steps shifts to a high collector voltage (the collector voltage Vc is high) side.

On the other hand, with respect to the V-I diagram of the semiconductor device 100, the semiconductor device 100 has the mesa portion 60 between the dummy trench portion 30 and the emitter contact trench portion 40, and thus the PNP parasitic transistor is easily turned on. On the other hand, the semiconductor device 100 has the accumulation region 16, and thus is also affected such that the PNP parasitic transistor is hardly turned on. Therefore, the rise due to the stepwise operation in two steps is shown.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, specification, or diagrams can be performed in any order as long as the order is not indicated by "prior to," "before," or the like and as long as the output from a previous process is not used in a later process. Even if the operation flow is described using phrases such as "first" or "next" in the claims, specification, or diagrams, it does not necessarily mean that the process must be performed in this order.

What is claimed is:
1. A semiconductor device comprising:
an emitter region of a first conductivity type, provided on a front surface side of a semiconductor substrate;
a contact region of a second conductivity type, provided on the front surface side of the semiconductor substrate;
one or more first trench portions which are electrically connected to a gate electrode and are in contact with emitter regions;
a second trench portion which is adjacent to one of the one or more first trench portions, is electrically connected to the gate electrode, and is in contact with the emitter region; and a dummy trench portion which is adjacent to one of the one or more first trench portions and is electrically connected to an emitter electrode, wherein a region where the second trench portion is in contact with the emitter region is narrower than a region where the first trench portion is in contact with the emitter region.

2. The semiconductor device according to claim 1, wherein the emitter region extends from the second trench portion to the first trench portion.

3. The semiconductor device according to claim 1, wherein the emitter region extends from the second trench portion and terminates between the first trench portion and the second trench portion.

4. The semiconductor device according to claim 1, wherein the dummy trench portion is in contact with the emitter region.

5. The semiconductor device according to claim 1, wherein the dummy trench portion is not in contact with the emitter region.

* * * * *